United States Patent
Onaka et al.

(10) Patent No.: US 7,394,589 B2
(45) Date of Patent: Jul. 1, 2008

(54) OPTICAL AMPLIFIER FOR WIDE BAND RAMAN AMPLIFICATION OF WAVELENGTH DIVISION MULTIPLEXED (WDM) SIGNAL LIGHTS

(75) Inventors: Miki Onaka, Kawasaki (JP); Tomoto Tanaka, Kawasaki (JP); Etsuko Hayashi, Yamato (JP); Yasushi Sugaya, Kawasaki (JP); Susumu Kinoshita, Plano, TX (US)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/299,808

(22) Filed: Nov. 20, 2002

(65) Prior Publication Data

US 2003/0095323 A1 May 22, 2003

Related U.S. Application Data

(62) Division of application No. 09/694,489, filed on Oct. 24, 2000, now Pat. No. 6,510,000.

(30) Foreign Application Priority Data

Aug. 31, 2000 (JP) ............................. 2000-262080

(51) Int. Cl.
*H01S 3/00* (2006.01)
(52) U.S. Cl. ....................................... 359/334
(58) Field of Classification Search ............. 359/337.4, 359/334
See application file for complete search history.

(56) References Cited

U.S. PATENT DOCUMENTS 4,401,364 A 8/1983 Mochizuki ............... 350/96.16

(Continued)

FOREIGN PATENT DOCUMENTS

EP 1 018 666 A1 7/2000

(Continued)

OTHER PUBLICATIONS

Giles, C. R. Lightwave Applications of Fiber Bragg Gratings. Journal of Lightwave Technology. vol. 15. No. 8. Aug. 1997. p. 1391-1404.*

(Continued)

*Primary Examiner*—Deandra M Hughes
(74) *Attorney, Agent, or Firm*—Staas & Halsey LLP

(57) ABSTRACT

A Raman amplifier providing a wideband gain for use in a wavelength division multiplexing (WDM) optical communication system. In one embodiment, a first optical amplifier Raman amplifies a wavelength division multiplexed signal light in both a first wavelength band and a second wavelength band in accordance with a plurality of excitation (pumping) lights provided to the first optical amplifier, the first and second wavelength bands being different from each other. A divider divides the amplified signal light into first and second lights in the first and second wavelength bands, respectively. A second optical amplifier amplifies the first light and has a gain band in the first wavelength band. The third optical amplifier amplifies the second light and has a gain in the second wavelength band. In various embodiments, a gain equalizer and/or an optical isolator is used in combination with the first optical amplifier providing the Raman amplification. A controller is also provided to control the excitation lights provided to the first optical amplifier to achieve specific effects.

25 Claims, 26 Drawing Sheets

U.S. PATENT DOCUMENTS

| | | | | |
|---|---|---|---|---|
| 4,616,898 A | 10/1986 | Hicks, Jr. | ................. | 350/96.18 |
| 4,805,977 A | 2/1989 | Tamura et al. | ........... | 359/96.16 |
| 5,920,423 A | 7/1999 | Grubb et al. | ................ | 359/341 |
| 5,933,270 A * | 8/1999 | Toyohara | ................ | 359/341.3 |
| 5,936,763 A | 8/1999 | Mitsuda et al. | ............. | 359/341 |
| 6,049,417 A | 4/2000 | Srivastava et al. | ........... | 359/341 |
| 6,049,418 A | 4/2000 | Srivastava et al. | ........... | 359/341 |
| 6,052,394 A | 4/2000 | Lee et al. | ....................... | 372/6 |
| 6,081,366 A * | 6/2000 | Kidorf et al. | ........... | 359/341.32 |
| 6,104,527 A | 8/2000 | Yang | ........................ | 359/341 |
| 6,115,174 A | 9/2000 | Grubb et al. | ................ | 359/334 |
| 6,151,160 A | 11/2000 | Ma et al. | .................... | 359/341 |
| 6,236,487 B1 * | 5/2001 | Stephens | .................... | 398/160 |
| 6,236,498 B1 * | 5/2001 | Freeman et al. | ........... | 359/337.1 |
| 6,275,313 B1 * | 8/2001 | Denkin et al. | .................. | 398/9 |
| 6,292,288 B1 * | 9/2001 | Akasaka et al. | ............. | 359/334 |
| 6,310,716 B1 * | 10/2001 | Evans et al. | ................. | 359/334 |
| 6,317,254 B1 | 11/2001 | Park et al. | ................... | 359/341 |
| 6,344,922 B1 * | 2/2002 | Grubb et al. | ................ | 359/334 |
| 6,356,383 B1 * | 3/2002 | Cornwell et al. | ........... | 359/334 |
| 6,359,725 B1 * | 3/2002 | Islam | ......................... | 359/334 |
| 6,381,065 B1 | 4/2002 | Homsey | ................ | 359/341.32 |
| 6,421,167 B1 * | 7/2002 | Cohen et al. | ................ | 359/337 |
| 6,429,966 B1 * | 8/2002 | Hazell et al. | ........... | 359/341.41 |
| 6,603,896 B1 * | 8/2003 | MacCormack et al. | ........ | 385/24 |
| 6,631,028 B1 * | 10/2003 | Islam | ......................... | 359/349 |
| 6,678,087 B1 * | 1/2004 | Masuda et al. | .............. | 359/334 |
| 6,725,524 B2 * | 4/2004 | Lin et al. | ...................... | 29/596 |

FOREIGN PATENT DOCUMENTS

| | | | |
|---|---|---|---|
| JP | | 2001-7768 | 1/2001 |
| JP | | 2001308791 A * | 11/2001 |

OTHER PUBLICATIONS

Kawai et al. Wide-bandwidth and Long-Distance WDM Transmission Using Highly Gain-Flattened Hybrid Amplifier. IEEE Photonics Technology Letters, vol. 11, No. 7, Jul. 1999. pp. 886-888.*

U.S. Appl. No. 09/531,015, filed Mar. 20, 2000, Onaka, et al, Fujitsu Limited.

* cited by examiner

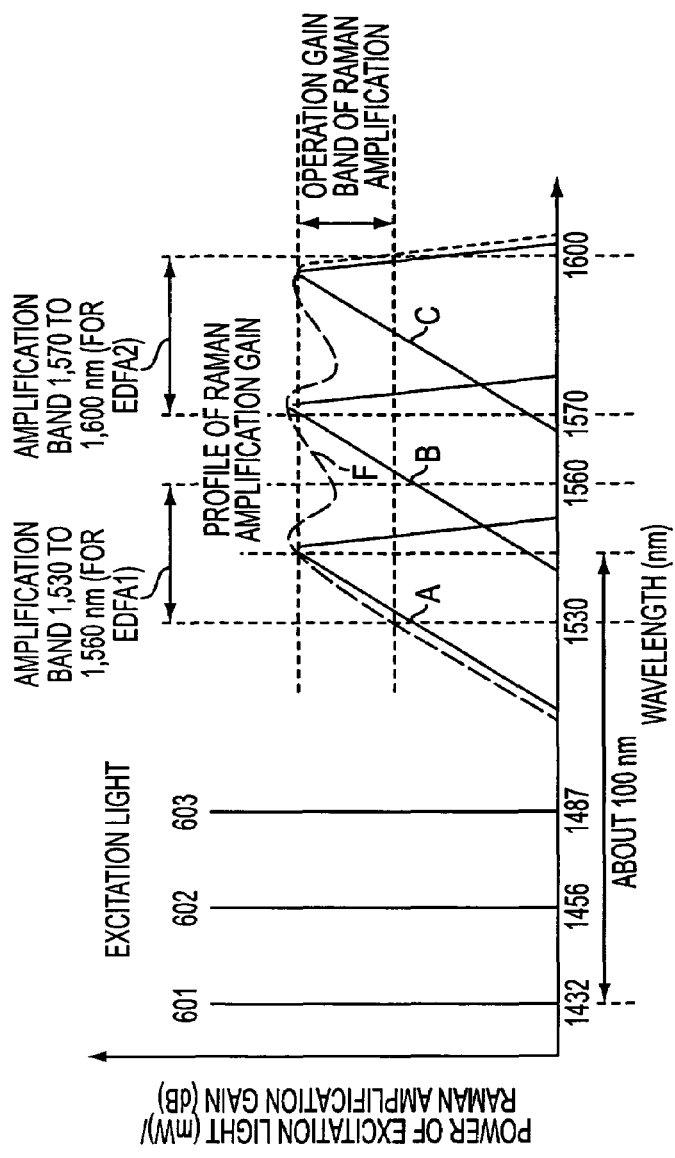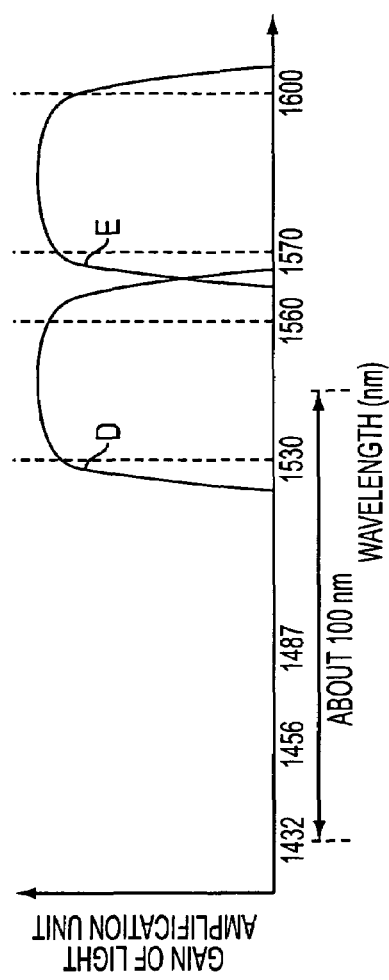
FIG. 3A
FIG. 3B

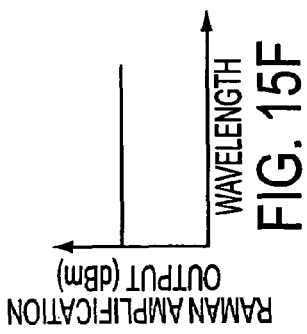
FIG. 15A
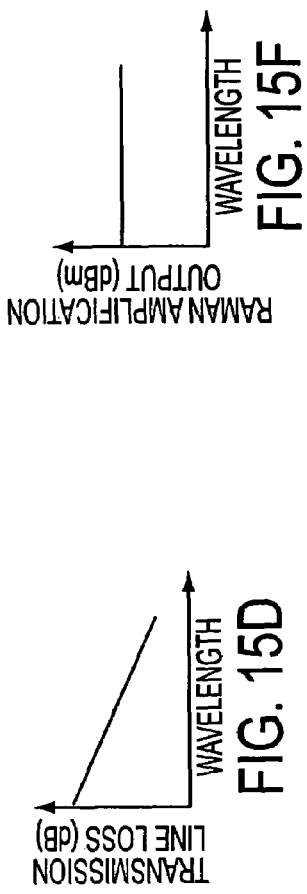
FIG. 15B
FIG. 15C
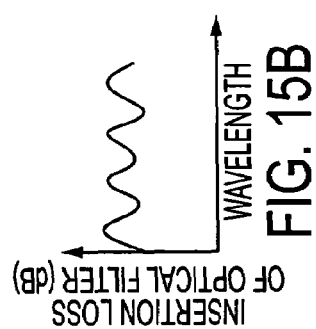
FIG. 15D
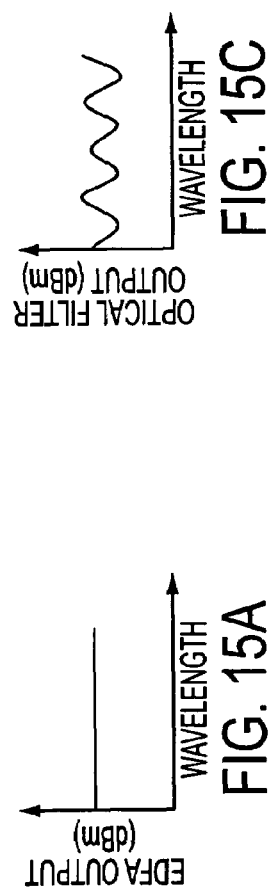
FIG. 15E
FIG. 15F

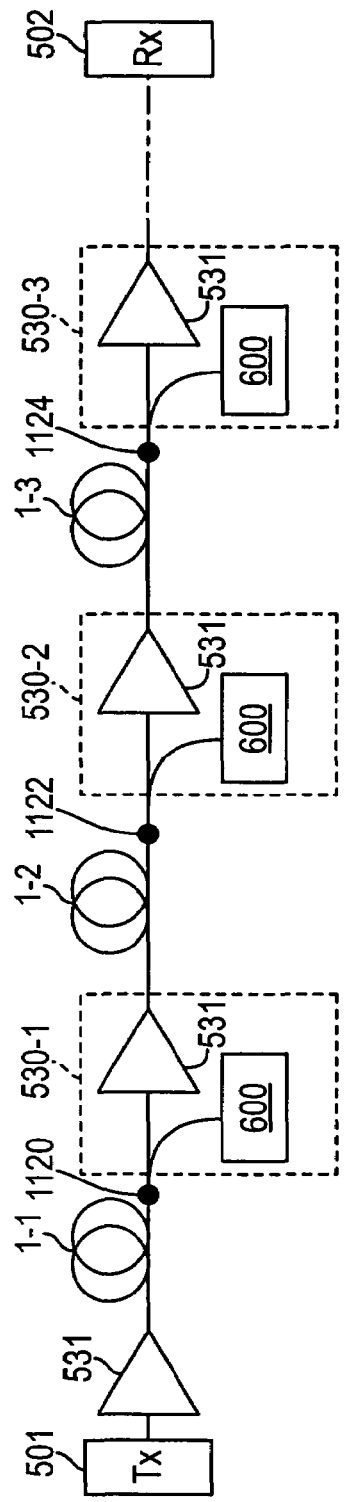
FIG. 16A
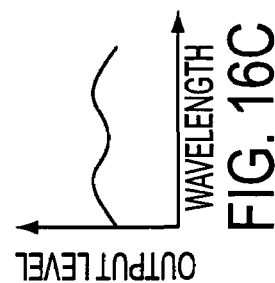
FIG. 16D
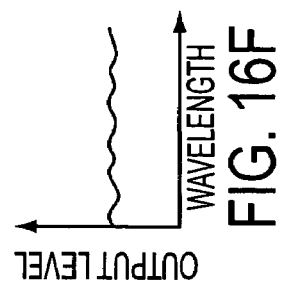
FIG. 16G
FIG. 16C
FIG. 16F
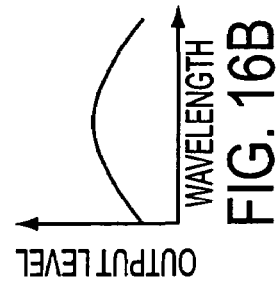
FIG. 16B
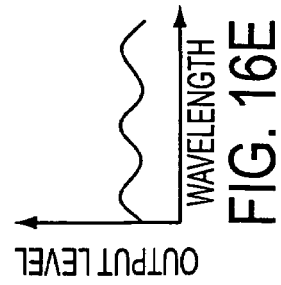
FIG. 16E

OPTICAL AMPLIFIER FOR WIDE BAND RAMAN AMPLIFICATION OF WAVELENGTH DIVISION MULTIPLEXED (WDM) SIGNAL LIGHTS

This application is a divisional of application number 09/694,489, filed Oct. 24, 2000, now U.S. Pat. No. 6,510,000.

CROSS-REFERENCE TO RELATED APPLICATIONS

The present application is based on, and claims priority to, Japanese patent application 2000-262080, filed Aug. 31, 2000, in Japan, and which is incorporated herein by reference.

This application is related to U.S. patent application Ser. No. 09/531,015, filed Mar. 20, 2000, and which is incorporated herein by reference.

BACKGROUND OF THE INVENTION

1. Field of the Invention

The present invention relates to a Raman amplifier for wideband Raman amplification of wavelength division multiplexed (WDM) signal lights.

2. Description of the Related Art

In a wavelength division multiplexing (WDM) optical communication system, a plurality of signal lights at different wavelengths are multiplexed together, and then transmitted through a single optical fiber operating as an optical transmission line. Such a WDM optical communication system has a very high capacity for information transmission, and is currently being used as a basic technology for backbone networks supporting Internet services.

To transmit signal lights over long distances, optical amplifiers are positioned along the transmission line, to amplify the multiplexed signal lights. Such optical amplifiers include rare-earth element dope optical fiber amplifiers, such as erbium doped optical fiber amplifiers (EDFA), and Raman amplifiers.

In a WDM optical communication system using an optical amplifier, the maximum limit of optical transmission power is restricted by the degradation of light waveform and cross-talk caused by nonlinear optical effects in the transmission line.

Moreover, the minimum limit of optical transmission power is restricted by the deterioration of optical signal-to-noise ratio (SNR) caused by optical noise, e.g. amplitude stimulated emission light, generated by the optical amplifier.

For a high-capacity WDM optical communication system which multiplexes tens to hundreds of signal lights together, the use of Raman amplifiers together with EDFAs installed at intervals of several tens of kilometers is regarded as a promising technology to compensate for loss in the transmission line by reducing nonlinear optical effects and deterioration of optical SNR.

Various combinations of Raman amplifiers with EDFAs have been proposed, but such proposals do not consider the situation where the number of multiplexed signal lights at different wavelengths is further increased to thereby increase capacity of the system.

SUMMARY OF THE INVENTION

Accordingly, it is an object of the present invention to provide a Raman amplifier which provides a wide gain band for use in a WDM optical communication system.

It is also an object of the present invention to provide a Raman amplifier which provides a wide gain band and is employed in combination with EDFAs in a WDM optical communication system.

Additional objects and advantages of the invention will be set forth in part in the description which follows, and, in part, will be obvious from the description, or may be learned by practice of the invention.

The foregoing objects of the present invention are achieved by providing an apparatus including (a) a first optical amplifier amplifying a signal light in accordance with a plurality of excitation lights at different wavelengths provided to the first optical amplifier; (b) a band divider dividing the amplified signal light into a plurality of divided signals in a plurality of different wavelength bands, respectively; and (c) a second optical amplifier having a gain in a respective wavelength band of the plurality of wavelength bands, and amplifying the divided signal in the respective wavelength band.

Objects of the present invention are also achieved by providing an apparatus including (a) a first optical amplifier Raman amplifying a signal light in both a first wavelength band and a second wavelength band in accordance with a plurality of excitation lights provided to the first optical amplifier, the first and second wavelength bands being different from each other; (b) a divider dividing the amplified signal light into first and second lights in the first and second wavelength bands, respectively; (c) a second optical amplifier amplifying the first light and having a gain band in the first wavelength band; and (d) a third optical amplifier amplifying the second light and having a gain in the second wavelength band.

Moreover, objects of the present invention are achieved by providing an apparatus including (a) an optical fiber; (b) an excitation light causing a Raman gain to occur in the optical fiber; and (c) a gain equalizer compensating a gain characteristic of the Raman gain.

Objects of the present invention are achieved by providing an apparatus including (a) an optical fiber; (b) a first coupler coupling excitation lights from a plurality of excitation light sources together; (c) a second coupler providing the coupled excitation lights to the optical fiber, the coupled excitation lights provided to the optical fiber causing a Raman gain to occur in the optical fiber; and (d) an optical device optically connected between the first and second couplers and preventing light from the optical fiber from traveling to the excitation light sources.

In addition, objects of the present invention are achieved by providing a method of optical amplifying including (a) Raman amplifying a light with a first optical amplifier in accordance with excitation light provided to the first optical amplifier, the first optical amplifier having a corresponding Raman wavelength band of gain; (b) amplifying amplified light of the first optical amplifier with a second optical amplifier having a corresponding wavelength band of gain; and (c) expanding the Raman wavelength band of gain of the first optical amplifier when adding a third optical amplifier having a corresponding wavelength band of gain different than the wavelength band of gain of the second optical amplifier, the third optical amplifier being added in parallel with the second optical amplifier to amplify amplified light of the first optical amplifier.

Objects of the present invention are also achieved by providing an apparatus including (a) a first optical amplifier Raman amplifying a light in accordance with a plurality of excitation lights provided to the first optical amplifier; and (b) a second optical amplifier the receiving the amplified light and amplifying the received light, wherein the first optical amplifier controls a power level of the amplified light as received by the second optical amplifier to be constant.

Further, objects of the present invention are achieved by providing an apparatus including (a) an optical amplification medium through which light travels, the optical amplification medium including, or being optically connected to, a transmission line through which the light travels; (b) excitation light sources providing excitation lights; (c) a coupler coupling the excitation lights to the optical amplification medium, the coupled f excitation lights causing the light traveling through the optical amplification medium to be Raman amplified; and (d) a controller controlling a gain characteristic of the optical amplification medium in accordance with a condition of the transmission line.

Objects of the present invention are also achieved by providing an apparatus including (a) an optical fiber transmission line having first and second sections, light traveling through the first and second sections; (b) a first excitation light source providing excitation light to the first section so that the light traveling through the first section is Raman amplified in the first section; (c) a second excitation light source providing excitation light to the second section so that the light traveling through the second section is Raman amplified in second section, the excitation light provided by the first excitation light source being at a different wavelength than the excitation light provided by the second excitation light source.

BRIEF DESCRIPTION OF THE DRAWINGS

These and other objects and advantages of the invention will become apparent and more readily appreciated from the following description of the preferred embodiments, taken in conjunction with the accompanying drawings of which:

FIGS. 3(A) and 3(B) are diagrams showing a Raman gain profile, according to an embodiment of the present invention.

FIGS. 15(A), 15(B), 15(C), 15(D), 15(E), 15(F) and 15(G) are diagrams showing an effect of Raman amplification, according to an embodiment of the present invention.

FIGS. 16(A), 16(B), 16(C), 16(D), 16(E), 16(F) and 16(G) are diagrams showing an optical communication system using a plurality of Raman amplifiers, according to an embodiment of the present invention.

DESCRIPTION OF THE PREFERRED EMBODIMENTS

Figure 1:
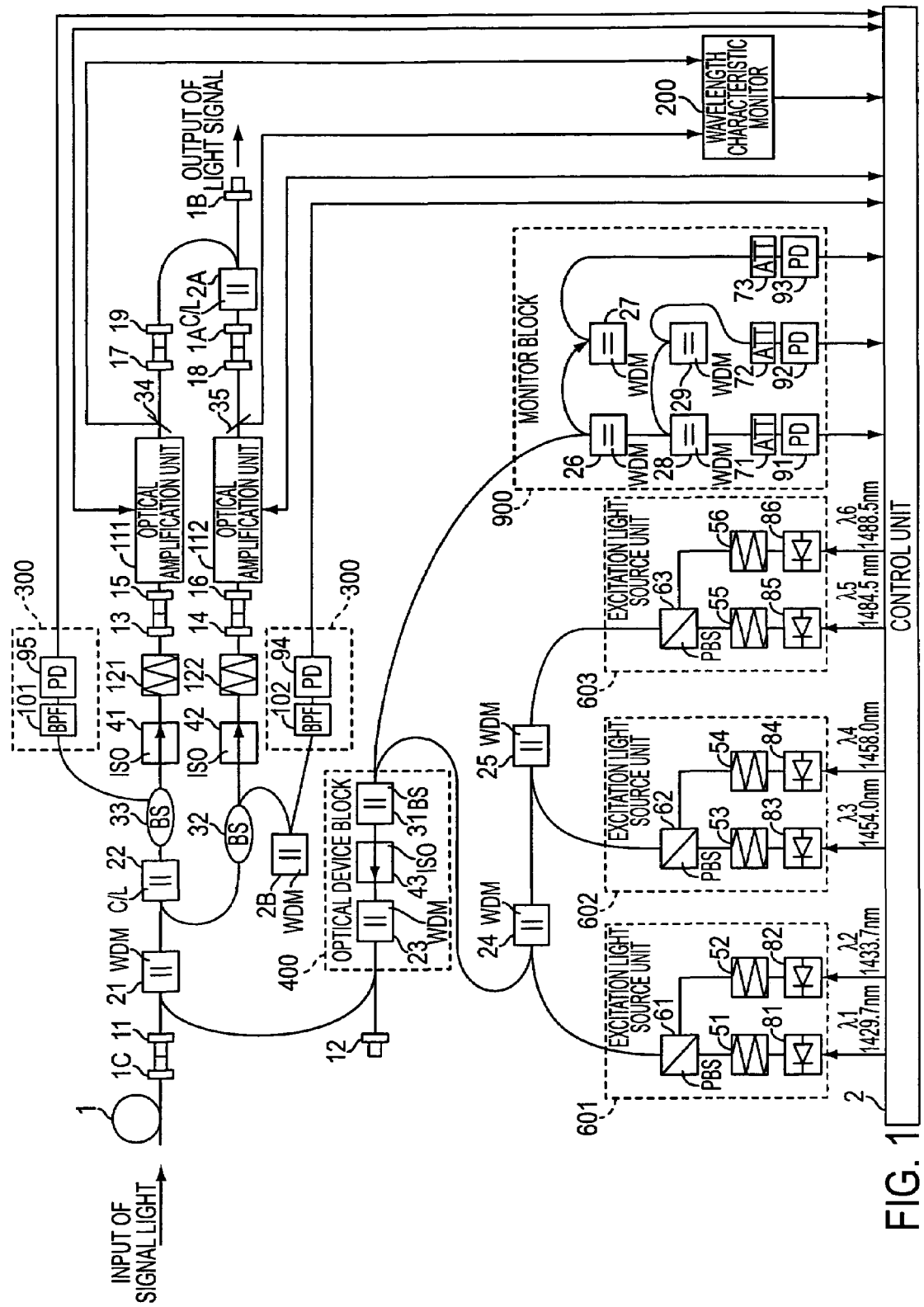
FIG. 1 is a diagram showing an optical amplifier, according to an embodiment of the present invention.

Reference will now be made in detail to the present preferred embodiments of the present invention, examples of which are illustrated in the accompanying drawings, wherein like reference numerals refer to like elements throughout.

FIG. 1 is a diagram showing an optical amplifier, according to an embodiment of the present invention. Referring now to FIG. 1, a transmission line 1 is connected to a WDM coupler 21 via optical connectors 1C and 11. Transmission line 1 can be an ordinary 1.3 µm zero-dispersion fiber, a dispersion compensation fiber (DCF) with a large dispersion value, a dispersion shift fiber (DSF) with zero-dispersion value shifted or a nonzero-dispersion shift fiber (NZ-DSF). DCF, DSF and NZ-DSF can be used as a Raman amplification medium because these fibers have small effective cross-section areas and cause large nonlinear effects.

Wavelength division multiplexed (WDM) light includes a plurality of signal lights wavelength multiplexed together. The WDM light travels through transmission line 1.

WDM coupler 21 passes the WDM light, and also causes excitation (pumping) light to be input to transmission line 1. Transmission line 1 amplifies the WDM light via a Raman amplification effect, in accordance with the excitation lights input to transmission line 1.

Excitation light is produced by a plurality of excitation light source units 601, 602, and 603. Excitation light source unit 601 has light sources 81 and 82, fiber grating filters 51 and 52, and a polarization coupler (PBS) 61. Light source 81 feeds back, for example, 1429.7 nm light by fiber grating filter 51 and performs external resonance so that the light having wavelengths around 1429.7 nm is emitted, and inputs the light to polarization coupler 61.

Light source 82 feeds back, for example, 1433.7 nm light by fiber grating filter 52 and performs external resonance so that the light having wavelengths around 1433.7 nm is emitted, and inputs the light to polarization coupler 61. Polarization coupler 61 couples two lights right-angled which have passed fiber grating filters 51 and 52, and outputs the light to a WDM coupler 24.

Excitation light source unit 602 has light sources 83 and 84, fiber grating filters 53 and 54, and a polarization coupler (PBS) 62. Light source 83 feeds back, for example, 1454.0 nm light by fiber grating filter 53 and performs external resonance so that the light having wavelengths around 1454.0 nm is emitted, and inputs the light to polarization coupler 62. Light source 84 feeds back, for example, 1458.0 nm light by fiber grating filter 54 and performs external resonance so that the light having wavelengths around 1458.0 nm is emitted, and inputs the light to polarization coupler 62. Polarization coupler 62 couple two lights right-angled which have passed fiber grating filters 53 and 54, and outputs the light to WDM coupler 25.

Excitation light source unit 603 has light sources 85 and 86, fiber grating filters 55 and 56, and polarization coupler (PBS) 63. Light source 85 feeds back, for example, 1484.5 nm light by fiber grating filter 55 and performs external resonance so that the light having wavelengths around 1484.5 nm is emitted, and inputs the light to polarization coupler 63. Light source 86 feeds back, for example, 1488.5 nm light by fiber grating filter 56 and performs external resonance so that the light having wavelengths around 1488.5 nm is emitted, and inputs the light to polarization coupler 63. Polarization coupler 63 couple two lights right-angled which have passed fiber grating filters 55 and 56, and outputs the light to WDM coupler 25.

The above description assumes that excitation light source units 601 to 603 use laser diodes as light sources 81 to 86. However, the configuration is not limited to the one shown in FIG. 1, as long as the desired gain and wavelength characteristics are obtained in transmission line 1.

A WDM coupler 25 passes the light from excitation light source unit 603, reflects the light from excitation light source unit 602, multiplexes the wavelengths of the light from excitation light source units 603 and 602, and inputs the light to WDM coupler 24.

WDM coupler 24 passes the wavelength-multiplexed light from WDM coupler 25 and reflects the light from excitation light source unit 601 for multiplexing the wavelengths of the light from excitation light source unit 601 and WDM coupler 25.

The wavelengths multiplexed light by WDM coupler 24 is input to an optical device block 400. In this embodiment, optical device block 400 includes a beam splitter (BS) 31, an optical isolator (ISO) 43, and a WDM coupler 23. Beam splitter 31 branches a part of the wavelength-multiplexed light from excitation light source units 601, 602, and 603, and inputs the branched light to monitor block 900. Optical isolator 43 prevents light returning from transmission line 1 which is reflected by WDM coupler 21 from being input to excitation light source units 601, 602, and 603. For example, optical isolator prevents the return of excitation light and cross-talk of signal light.

WDM coupler 23 reflects a component of wavelength-multiplexed light, passes a component of excitation light, and outputs the reflected wavelength-multiplexed light from an optical connector 12 for monitoring of wavelength-multiplexed light and cross talk reflected from transmission line 1 by WDM coupler 21.

WDM coupler 23 and optical isolator 43 prevent the light from transmission line 1 from being input to excitation light source units 601, 602 and 603.

An excitation light monitor unit 900 includes WDM couplers 26 to 29, optical attenuators 71 to 73, and photo-detectors 91 to 93. WDM coupler 26 reflects light having a wavelength corresponding to excitation light source unit 601 among the excitation light outputs branched by beam splitter 31, and passes other light. The light having the wavelength corresponding to excitation light source unit 601 which is reflected by WDM coupler 26 is filtered via WDM coupler 27, attenuated to a specified level by optical attenuator 73, then received by photodetector 93. Based on an output power from photo-detector 93, a power output from excitation light source unit 601 is controlled by a control unit 2.

A light passing through WDM coupler 26 is input to WDM coupler 28. WDM coupler 28 reflects the light component having a wavelength corresponding to excitation light source unit 602, and passes the remaining light component. The light having the wavelength corresponding to excitation light source unit 602 which is reflected by WDM coupler 28 is filtered via WDM coupler 29, attenuated to a specified level by optical attenuator 72, then received by photodetector 92. Based on the output from photo-detector 92, the power output from excitation light source unit 602 is controlled by control unit 2.

The light passing through WDM coupler 28 has a wavelength corresponding to excitation light source unit 601. The light is attenuated to a specified level by optical attenuator 71, then received by photo-detector 91. Based on the output from photo-detector 91, the power output from excitation light source unit 603 is controlled by control unit 2.

Control unit 2 notifies optical amplification units 111 and 112 of the information on excitation light power obtained from monitor block 900 to enable optical amplification units 111 and 112 to perform gain control using the information together with monitor and control information.

The wavelength-multiplexed light passing WDM coupler 21 is input to a WDM coupler (C/L) 22 which passes light in a first wavelength band (e.g., 1530 to 1560 nm) and reflects light in a second wavelength band (e.g., 1570 to 1600 nm). The first wavelength band corresponds to the amplification gain band of optical amplification unit 111, which is connected after WDM coupler 22. The second wavelength band corresponds to the amplification gain band of optical amplification unit 112, which is connected after WDM coupler 22.

The light in the first wavelength band separated by WDM coupler 22 is partly separated into components by a beam splitter (BS) 33. The wavelength band including the signal light separated by WDM coupler 22 is selected by a band-pass filter (BPF) 101, and the selected signal light is received by a photo-detector (PD) 95. The light in the second wavelength band separated by WDM coupler 22 is partly separated into components by beam splitter 32 and passes through a WDM coupler 2b. The wavelength band including the signal light separated by WDM coupler 22 is selected by a band-pass filter 102, and the selected signal light is received by a photo-detector (PD) 94.

The output from beam splitter 33 is input to an optical isolator (ISO) 41. Optical isolator 41 prevents light from returning from optical amplification unit 111 which is connected after optical isolator 41 to transmission line 1. The output from beam splitter 32 is input to an optical isolator (ISO) 42. Optical isolator 42 prevents light from returning from optical amplification unit 112 which is connected after optical isolator 42 to transmission line 1. The output from optical isolator 41 is input to a gain equalizer 121. Gain equalizer 121 equalizes the Raman amplification gain in the first wavelength band which is produced in transmission line 1 by the excitation light from excitation light source units 601, 602 and 603. Gain equalizer 121 equalizes the gain so that distorted wavelength characteristics are adjusted to be linear characteristics with a specified tilt or consistent characteristics independent of wavelength.

The output from optical isolator 42 is input to a gain equalizer 122. Gain equalizer 122 equalizes the Raman amplification gain in the second wavelength band which is produced in transmission line 1 by the excitation light from excitation light source units 601, 602 and 603. Gain equalizer 122 equalizes the gain so that distorted wavelength characteristics are adjusted to be linear characteristics with a specified tilt or consistent characteristics independent of wavelength. The output from gain equalizer 121 is input to optical amplification unit 111 via optical connectors 13 and 15. Optical amplification unit 111 amplifies the light in the first wavelength band, and inputs it to a WDM coupler (C/L) 2A via optical connectors 17 and 19. The output from gain equalizer 122 is input to optical amplification unit 112 via optical connectors 14 and 16. Optical amplification unit 112 amplifies the light in the second wavelength band, and inputs it to WDM coupler 2A via optical connectors 18 and 1A.

WDM coupler 2A reflects the light from optical amplification unit 111 and passes the light from optical amplification unit 112 to multiplex wavelengths of the light from optical amplification units 111 and 112, then outputs multiplexed light from an optical connector 1B.

The light from optical amplification units 111 and 112 is branched by beam splitters 34 and 35, respectively, and input to a wavelength characteristic monitor 200. Wavelength characteristic monitor 200 separates each wavelength band into specified divisions so that wavelength characteristics in each wavelength band can be known, receives the signal light in each wavelength band by a photo-detector (not illustrated), and notifies control unit 2 of the result of reception. Control unit 2 performs constant control of output power and control of wavelength characteristics in the Raman amplification medium (that is, transmission line 1) on the basis of the information obtained from excitation light monitor unit 900 and input monitor unit 300 (which includes photo-detectors 94 and 95).

Control unit 2 also controls Raman gain profile and gain/wavelength characteristics on the basis of the information obtained from wavelength characteristic monitor unit 200. Control unit 2 controls the levels and wavelengths of excitation light outputs by performing the above control operations individually or in combinations.

The configuration shown in FIG. 1 has two optical amplification units and is explained as an optical amplifier that amplifies the light in two wavelength bands independently. However, the optical amplifier may have a configuration in which WDM coupler 22 divides wavelengths into more than two wavelength bands. Thus, the present invention is not limited to any particular number of wavelength bands.

If wavelengths are divided into more than two wavelength bands, the circuit components between WDM couplers 22 and 2A can be changed to a configuration that matches the number of divided wavelength bands.

In the system configuration shown in FIG. 1, optical amplification units 111 and 112 amplify the light in different wavelength bands. However, the units can have a common configuration.

Figure 2:
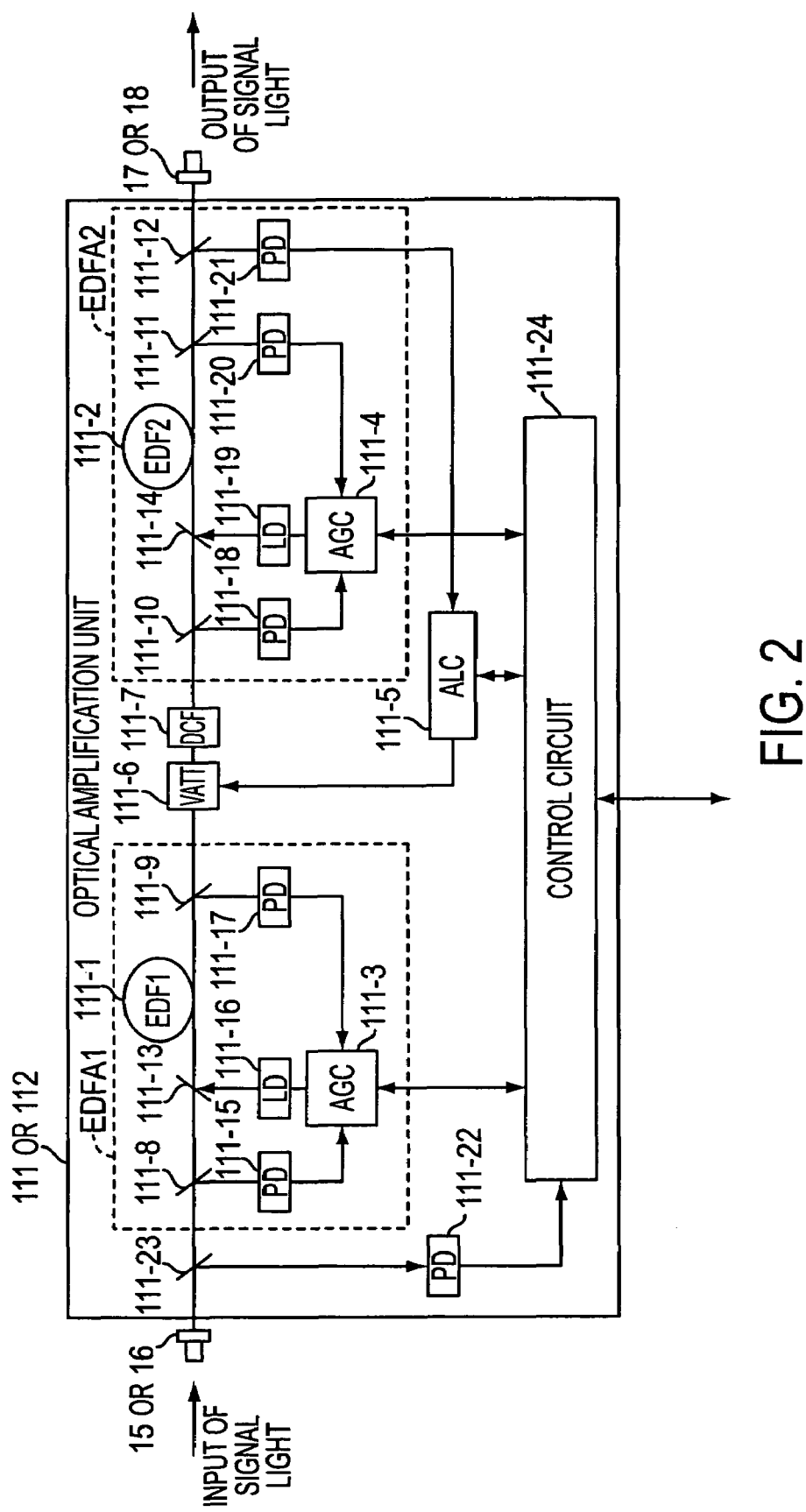
FIG. 2 is a diagram showing an optical amplification unit of the optical amplifier in FIG. 1, according to an embodiment of the present invention.

For example, FIG. 2 is a diagram showing an optical amplification unit having a common configuration and which can be used as optical amplification units 111 and 112, according to an embodiment of the present invention. Referring now to FIG. 2, the light branched by a beam splitter 111-23 is input to a photo-detector (PD) 111-22 which detects optical supervisory channel (OSC) light and outputs the detection result to a control circuit 111-24.

One output from beam splitter 111-23 is input to Erbium doped fiber amplifier EDFA1. The light input to EDFA1 is branched by a beam splitter 111-8. The light branched by beam splitter 111-8 is input to a photo-detector (PD) 111-15. The light input to photo-detector 111-15 is converted to an electric signal, and output to an automatic gain control circuit (AGC) 111-3 as input monitor data.

One output from beam splitter 111-8 is input to an Erbium doped fiber 111-1 via a WDM coupler 111-13 which multiplexes the wavelength of excitation light. The output from Erbium doped fiber 111-1 is branched by a beam splitter 111-9, and input to a photo-detector (PD) 111-17. Photo-detector 111-17 outputs output monitor data to automatic gain control circuit 111-3.

Automatic gain control circuit 111-3 controls the power level of an excitation light source (LD) 111-16 on the basis of the input monitor data from photo-detector 111-15, output monitor data from photo-detector 111-17, and gain information specified by an OSC signal information from control circuit 111-24.

The output from EDFA1 is input to Erbium doped fiber amplifier EDFA2 through a variable attenuator 111-6 and a dispersion compensator (DCF) 111-7. The light input to EDFA2 is branched by a beam splitter 111-10. The light branched by beam splitter 111-10 is input to a photo-detector (PD) 111-18. The light input to photo-detector 111-18 is converted to an electric signal, and output to an automatic gain control circuit (AGC) 111-4 as input monitor data.

One output from beam splitter 111-10 is input to an Erbium doped fiber 111-2 via a WDM coupler 111-14 which multiplexes the wavelength of excitation light. The output from Erbium doped fiber 111-2 is branched by a beam splitter 111-11, and input to a photo-detector (PD) 111-20. Photo-detector 111-20 outputs output monitor data to automatic gain control circuit 111-4.

Automatic gain control circuit 111-4 controls the power level of an excitation light source 111-19 (LD) on the basis of the input monitor data from photo-detector 111-18, output monitor data from photo-detector 111-20, and gain information specified by OSC signal information from control circuit 111-24.

EDFA1 and EDFA2 shown in FIG. 2 perform forward excitation for EDF 111-1 and EDF 111-2, respectively. Backward or two-way excitation can be applied.

FIGS. 3(A) and 3(B) are diagrams showing a Raman gain profile, according to an embodiment of the present invention. More specifically, FIG. 3(A) shows the wavelength characteristics of the Raman gain produced in transmission line 1 by the excitation light from excitation light source units 601 to 603. Referring now to FIG. 3(A), "A" indicates the profile of the Raman gain caused by the excitation light from excitation light source unit 601. "B" indicates the profile of the Raman gain caused by the excitation light from excitation light source unit 602. "C" indicates the profile of the Raman gain caused by the excitation light from excitation light source unit 603. "F" indicates the total gain characteristics in transmission line 1 caused by the excitation light from excitation light source units 601, 602, and 603.

The wavelength of each excitation light represents the peak of the optical power of the multiplexed light having the wavelengths of multiple excitation light sources in each excitation light source unit.

Almost constant Raman gains can be obtained in a broad band as indicated by "F" when the profiles of the gains caused by the different excitation light source units are overlaid with each other.

FIG. 3(B) shows the wavelength characteristics of the gains produced by optical amplification units 111 and 112. Referring now to FIG. 3(B), "D" indicates the wavelength characteristics of the gain caused by optical amplification unit 111. "E" indicates the wavelength characteristics of the gain caused by optical amplification unit 112. The power of excitation light is controlled so that excitation light source units 601 and 602 cover the wavelength band for the gain of optical amplification unit 111 and excitation light source units 602 and 603 cover the wavelength band for the gain of optical amplification unit 112.

Figure 4:
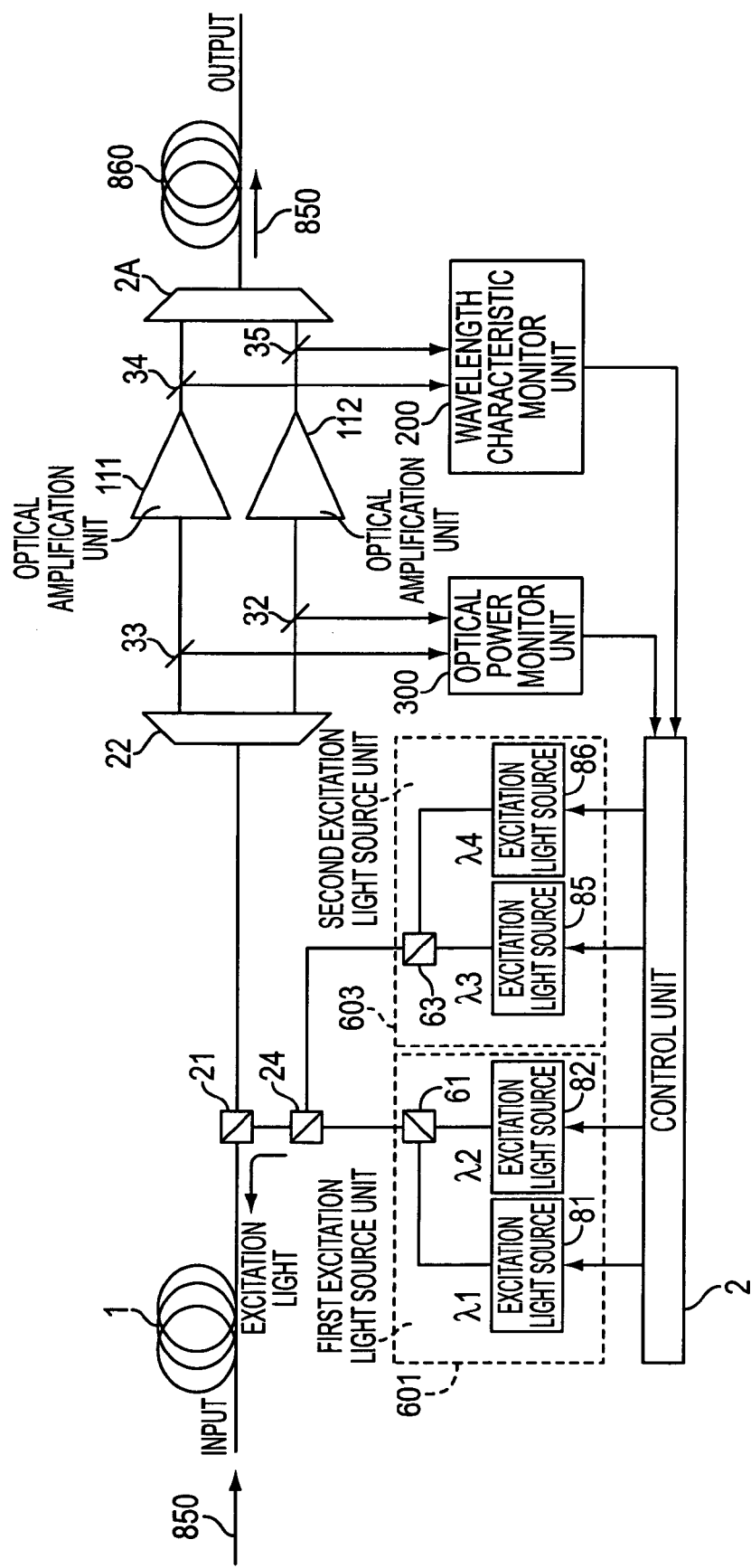
FIG. 4 is a diagram showing a parallel configuration of optical amplification units and a Raman amplifier, according to an embodiment of the present invention.

FIG. 4 is a diagram showing a parallel configuration of optical amplification units 111 and 112 and a Raman amplifier, according to an embodiment of the present invention. In FIG. 4, the components common to those shown in FIG. 1 are indicated by the same numbers as in FIG. 1 and are not explained below. The embodiment shown in FIG. 4 is a variation of the embodiment shown in FIG. 1. The embodiment shown in FIG. 4 has two excitation light source blocks so that the band of the Raman gain caused by an excitation light source unit corresponds to the band of amplification gain of an individual optical amplification unit.

Referring now to FIG. 4, signal light 850 is a wavelength divisional multiplexed signal light include a plurality of signal lights in the range, for example, of 1530 nm to 1610 nm, wavelength multiplexed together. Signal light 850 is input to transmission line 1 which operates as a Raman amplification medium.

Optical amplification unit 111 is an optical amplifier for a band from, for example, 1530 nm to 1560 nm, and optical amplification unit 112 is an optical amplifier for a band from, for example, 1570 nm to 1600 nm. Optical amplification units 111 and 112 are connected in parallel with each other.

Excitation light source unit 601 is a first excitation light source unit, the wavelength of light source 81 is set, for example, to 1,425 nm, and the wavelength of light source 82 is set, for example, to 1,440 nm. Excitation light source unit 603 is a second excitation light source unit, the wavelength of light source 85 is set, for example, to 1,465 nm, and the wavelength of light source 82 is set, for example, to 1,488 nm. Thus, the bands of the amplification gains of optical amplification units 111 and 112 are covered by excitation light source units 601 and 603, respectively.

In FIG. 4, the amplified signal light 850 is output to a transmission line 860.

Figure 5:
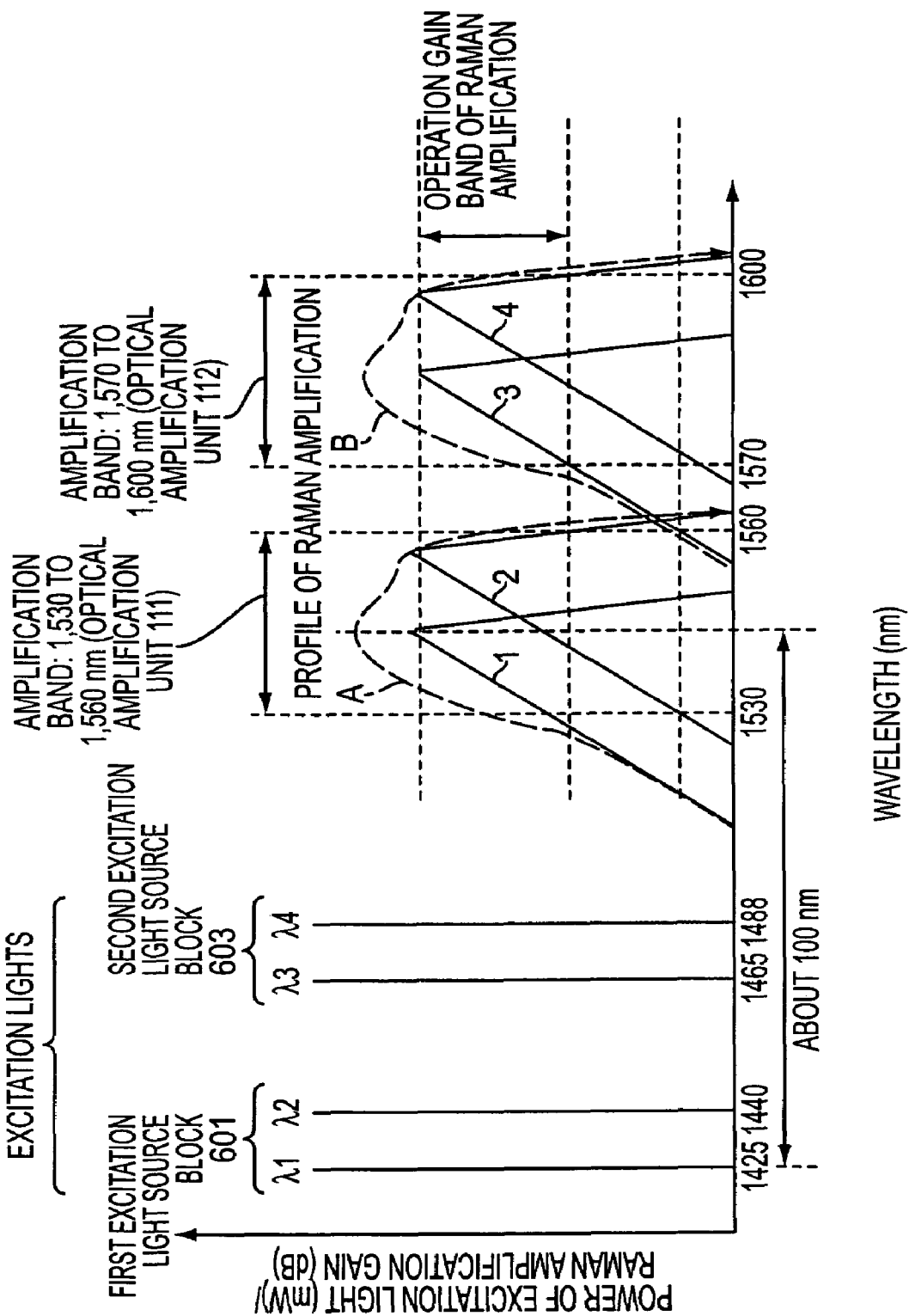
FIG. 5 is a diagram showing a Raman gain profile of the configuration in FIG. 4, according to an embodiment of the present invention.

FIG. 5 is a diagram showing a Raman gain profile of the configuration in FIG. 4, according to an embodiment of the present invention. More specifically, FIG. 5 shows detailed relationships between Raman gains and wavelength bands.

Referring now to FIG. 5, the light from excitation light source 81 corresponds to λ1, the light from excitation light source 82 corresponds to λ2, the light from excitation light source 85 corresponds to λ3, and the light from excitation light source 86 corresponds to λ4.

λ1 brings about Raman amplification gain profile 1, λ2 brings about Raman amplification gain profile 2, λ3 brings about Raman amplification gain profile 3, and λ4 brings about Raman amplification gain profile 4. Raman amplification gain profiles 1 and 2 can obtain combined gain profile "A" indicated by a dotted line. Raman amplification gain profiles 3 and 4 can obtain combined gain profile "B" indicated by a dotted line.

Thus, the Raman amplification gains corresponding to the wavelengths of the gains of multiple optical amplification units can be obtained in transmission line 1. In other words, a broadband Raman amplifier can be built by a combination of multiple light sources with different wavelengths as shown in FIG. 4.

The system shown in FIG. 4 applies a special configuration of excitation wavelengths that will not let the excitation light having a single wavelength cause Raman amplification in different wavelength bands assigned to multiple optical amplification units.

Further, the system configuration shown in FIG. 4 enables the user to expand or reduce the system. More specifically, the bands of Raman amplification gains of individual excitation light source units are designed to match the bands of amplification gains of corresponding optical amplification units. As a result, a user can expand or reduce the number of optical amplification units when the band of signal light to be used is expanded or reduced. Moreover, when the band for Raman amplification is expended or reduced, the user can expand or reduce excitation light source units according to the expansion or reduction of optical amplification units. Thus, the cost for initial system installation can be lowered and the system can be expanded later as required.

Moreover, if an excitation light source unit for the optical amplification wavelength band assigned to one optical amplification unit fails, the failed excitation light source unit can be replaced without influence given to the operation of the other optical amplification unit.

The following explains an example of expanding the signal light band in the system configuration shown in FIG. 4:

Initially, the user starts system operation using excitation light source unit 601 and optical amplification unit 111. When the user requests an increase in the number of signal light wavelengths and expansion of an amplification band, optical amplification unit 112 can be added to the system by connecting a connector (not shown) between WDM couplers 22 and 2A and the operation of excitation light source unit 603 can be started.

The band can be expanded even while optical amplification unit 111 is operating because excitation light source units 601 and 603 are independently linked to optical amplification units 111 and 112.

FIGS. 6-9 are diagrams showing examples of excitation light sources for Raman amplification, according to various embodiments of the present invention. These excitation light sources can replace portions of the excitation light sources in FIGS. 1, 4, 10-20, 22, and 24.

Figure 6:
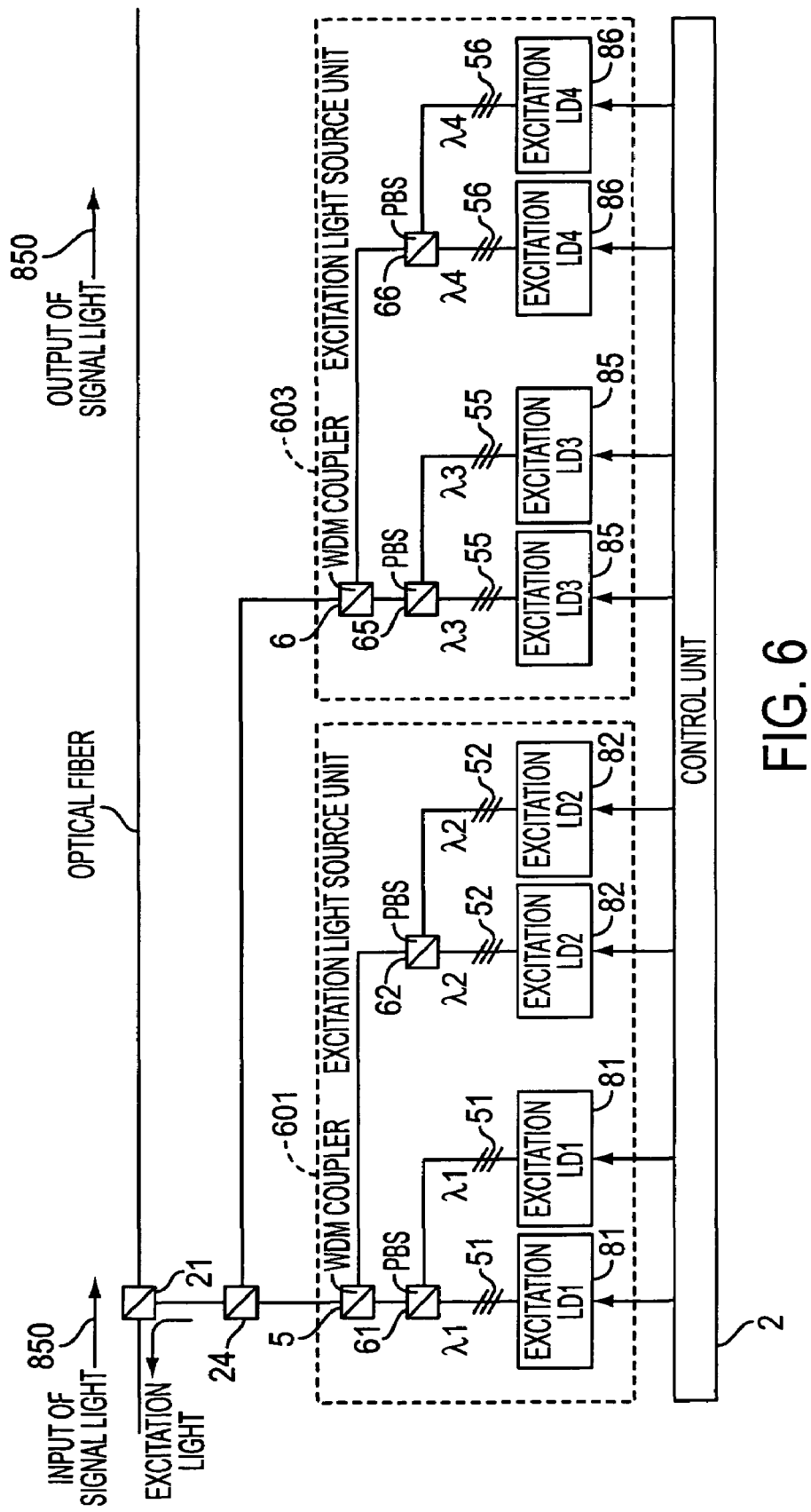
FIG. 6 is a diagram showing excitation light sources for Raman amplification, according to an embodiment of the present invention.

The configuration shown in FIG. 6 uses pairs of excitation LDs, each pair generating light of the same wavelength, to eliminate dependence of an excitation light wavelength on power or polarization. Polarization beam splitter 61 polarizes and synthesizes the outputs of two excitation light sources 81 having wavelength λ1 so that their polarizations are shifted by 90 degrees from each other. Two fiber grating filters 51 return the light of the same wavelength to the two excitation light sources 81. Excitation light sources 81 can be, for example, laser diodes (LD), so that fiber grating filters 51 cause external resonance to be performed between rear ends of the LDs.

Polarization beam splitter 62 polarizes and synthesizes the outputs of two excitation light sources 82 having wavelength λ2 so that their polarizations are shifted by 90 degrees from each other. Two fiber grating filters 52 return the light of the same wavelength to the two excitation light sources 82. Excitation light sources 82 can be, for example, laser diodes (LD), so that fiber grating filters 52 cause external resonance to be performed between rear ends of the LDs.

Polarization beam splitter 65 polarizes and synthesizes the outputs of two excitation light sources 85 having wavelength λ3 so that their polarizations are shifted by 90 degrees from each other. Two fiber grating filters 55 return the light of the same wavelength to the two excitation light sources 85. Excitation light sources 85 can be, for example, laser diodes (LD), so that fiber grating filters 55 cause external resonance to be performed between rear ends of the LDs.

Polarization beam splitter 66 polarizes and synthesizes the outputs of two excitation light sources 86 having wavelength λ4 so that their polarizations are shifted by 90 degrees from each other. Two fiber grating filters 56 return the light of the same wavelength to two excitation light sources 86. Excitation light sources 86 could be, for example, laser diodes (LD), so that fiber grating filters 56 cause external resonance to be performed between rear ends of the LDs.

The external resonance by fiber grating filters is performed because the oscillating wavelength and excitation spectrum of a semiconductor laser is changed if a laser drive condition (i.e., drive current or ambient temperature) is changed. A change in oscillating wavelength or excitation spectrum results in a change in the Raman gain spectrum.

To avoid this problem, an external resonance device (e.g., fiber grating filter) is connected on the output side of each semiconductor laser to fix the oscillating wavelength and excitation spectrum.

For example, when the drive current for a semiconductor laser is changed for adjustment of Raman amplification gain, the center wavelength fluctuates by up to around 15 nm and, accordingly, the wavelength characteristics of Raman amplification gain are changed largely. The external resonance device to fix the wavelength is used for this reason.

The light output from polarization coupler 61 and polarization coupler 62 having different wavelengths are wavelength-multiplexed by a WDM coupler 5. The light output from polarization coupler 65 and polarization coupler 66 having different wavelengths are wavelength-multiplexed by a WDM coupler 6. WDM coupler 24 multiplexes the wavelengths of the outputs from WDM couplers 5 and 6 and sends the wavelength-multiplexed excitation light to transmission line 1.

The excitation light from excitation light source unit 601 produces a gain in the band assigned to optical amplification unit 111 shown in FIG. 1. The excitation light from excitation light source unit 603 produces a gain in the band assigned to optical amplification unit 112 shown in FIG. 1.

As in the embodiment shown in FIG. 1, control unit 2 controls the output, wavelength, and cantor of gravity wavelength of excitation light by using the information from wavelength characteristic monitor unit 200, excitation light monitor unit 900, and input monitor unit 300 individually or in combinations.

Figure 7:
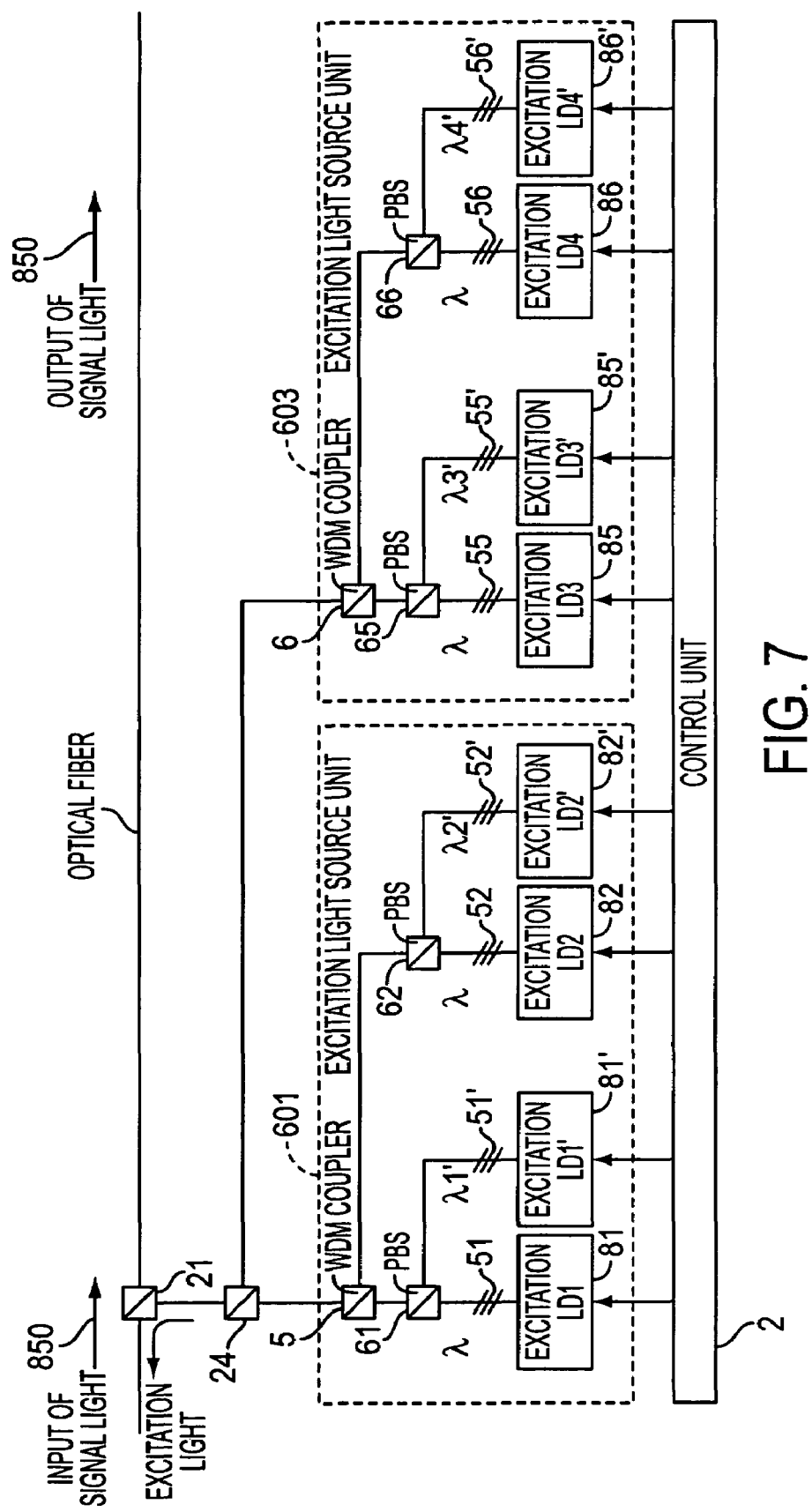
FIG. 7 is a diagram showing excitation light sources for Raman amplification, according to an additional embodiment of the present invention.

FIG. 7 shows a variation of the excitation light source unit shown in FIG. 6. In FIG. 7, each polarization coupler averages a wavelength characteristics of Raman gain profile for excitation lights of an excitation light source unit so that optical wavelengths of combined polarizations are slightly different in wavelength, for increasing the overlapping sections of the Raman gains caused by excitation light The space of wavelength combined by the polarization couplers is set, for example, to 6 nm or less so that most parts of the profiles of Raman amplification gains overlap each other. This design can eliminate the dependence of Raman amplification gain on polarization and increase the power of excitation light to be input to the fiber.

A Raman amplification gain is obtained only for the light component that matches the polarization of excitation light. If the excitation light is linearly polarization light and the fiber for amplification is not a polarization-maintaining fiber, the amplification gain fluctuates when the relative polarization of signal light and excitation light changes. However, if the excitation light components are combined so that their linear polarization are right-angled from each other, the fluctuation of amplification gain can be avoided.

An advantage of setting the interval of excitation light wavelengths to 6 nm or less is that most parts of the profiles of Raman amplification gains caused by different excitation light sources can overlap each other and the dependence of the gains on polarization can be eliminated. If the interval of wavelengths is increased in this range (up to 6 nm), the band of Raman amplification can be increased as far as possible to improve the flatness of gain/wavelength characteristics.

Next, referring again to FIG. 7, a WDM coupler 6 multiplexes the wavelengths of the light output from polarization couplers 65 and 66. In this case, the interval of wavelengths is set, for example, to 6 nm or more to increase the efficiency of combines in consideration of synthesizer characteristics.

Other components and control in FIG. 7 are the same as those shown in FIG. 6.

Figure 8:
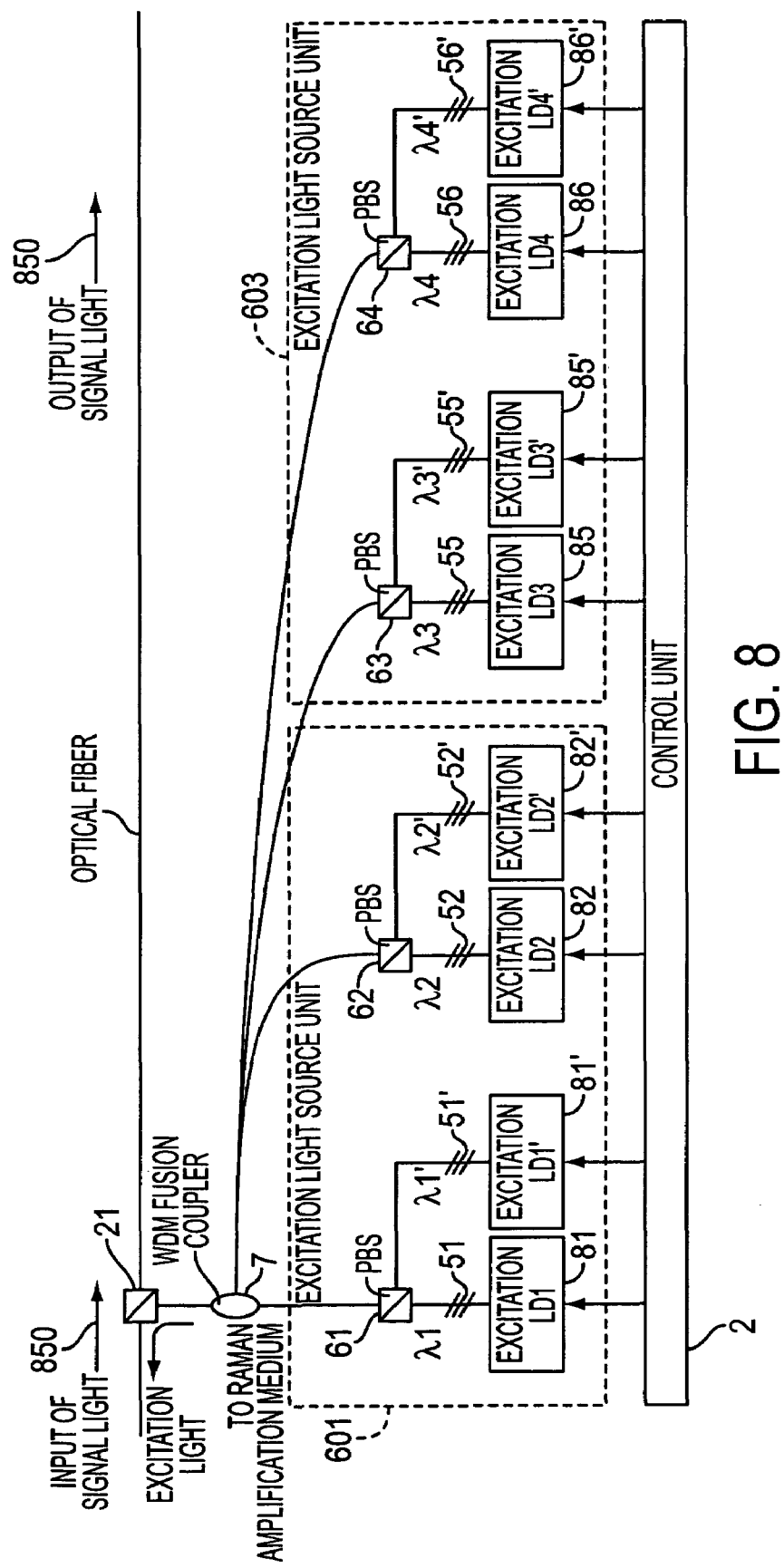
FIG. 8 is a diagram showing excitation light sources for Raman amplification, according to a further embodiment of the present invention.

FIG. 8 shows the an additional example of an excitation light source unit. The difference between the configurations shown in FIGS. 7 and 8 is that the configuration shown in FIG. 8 has a WDM fusion coupler 7 which can multiplex together the wavelengths of the multiple lights from polarization coupler 61, 62, 63 and 64 of excitation light source units 601 and 602. Other components and control are the same as those shown in FIG. 6.

In FIG. 8, the interval of the wavelengths to be synthesized by the polarization couplers is set, for example, to 6 nm or less. The input port is a polarization-holding fiber.

Figure 9:
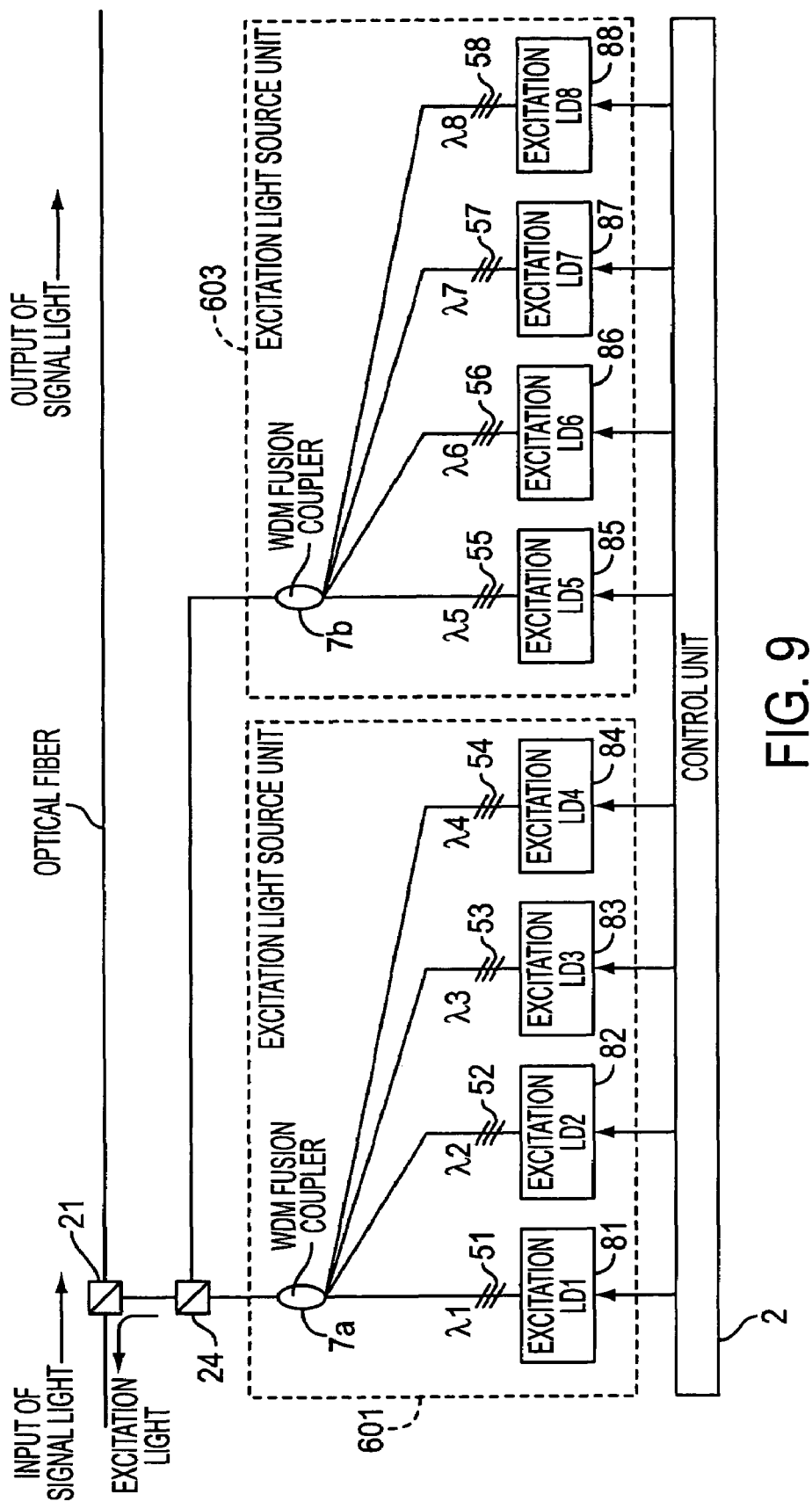
FIG. 9 is a diagram showing excitation light sources for Raman amplification, according to a still further embodiment of the present invention.

FIG. 9 shows a further example of an excitation light source unit. The difference between the configurations shown in FIGS. 7 and 9 is that the configuration shown in FIG. 9 has WDM fusion couplers 7A and 7B which can duplex the wavelengths of multiple rays of light without using polarization couplers of excitation light source units 601 and 602. Other components and control are the same as those shown in FIG. 6.

FIGS. 10 through 16 show embodiments of the present invention to compensate for gain distortion caused when Raman amplification is done using multiple excitation light sources, and explain the principles and variations of gain equalizers 121 and 122 shown in FIG. 1.

For example, FIGS. 10(A), 10(B), 10(C), 10(D) and 10(E) show a technique to prevent gain distortion against wavelengths that can be caused when the profiles of Raman amplification gains produced by the excitation light having multiple wavelengths are made overlapping each other and Raman amplification is done in a broad band.

Figure 10A:
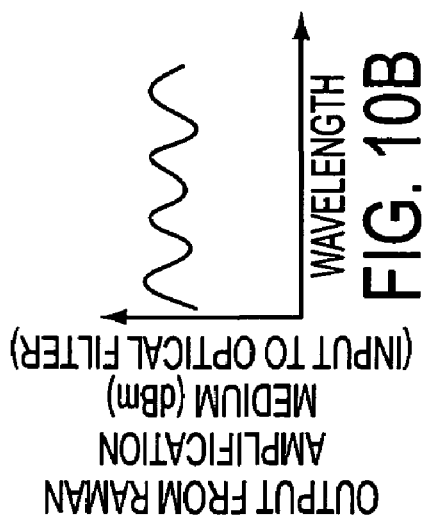
FIGS. 10(A), 10(B), 10(C), 10(D) and 10(E) are diagrams showing an effect of Raman amplification, according to an embodiment of the present invention.
Figure 10B:
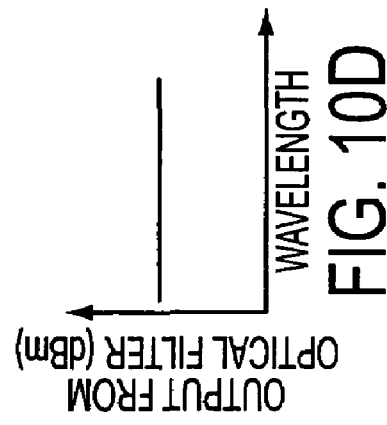
Figure 10C:
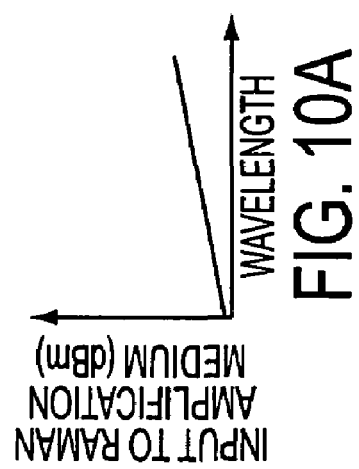
Figure 10D:
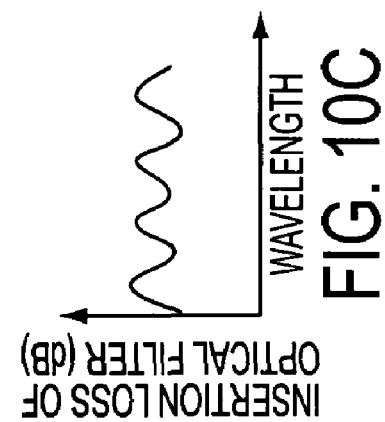
Figure 10E:
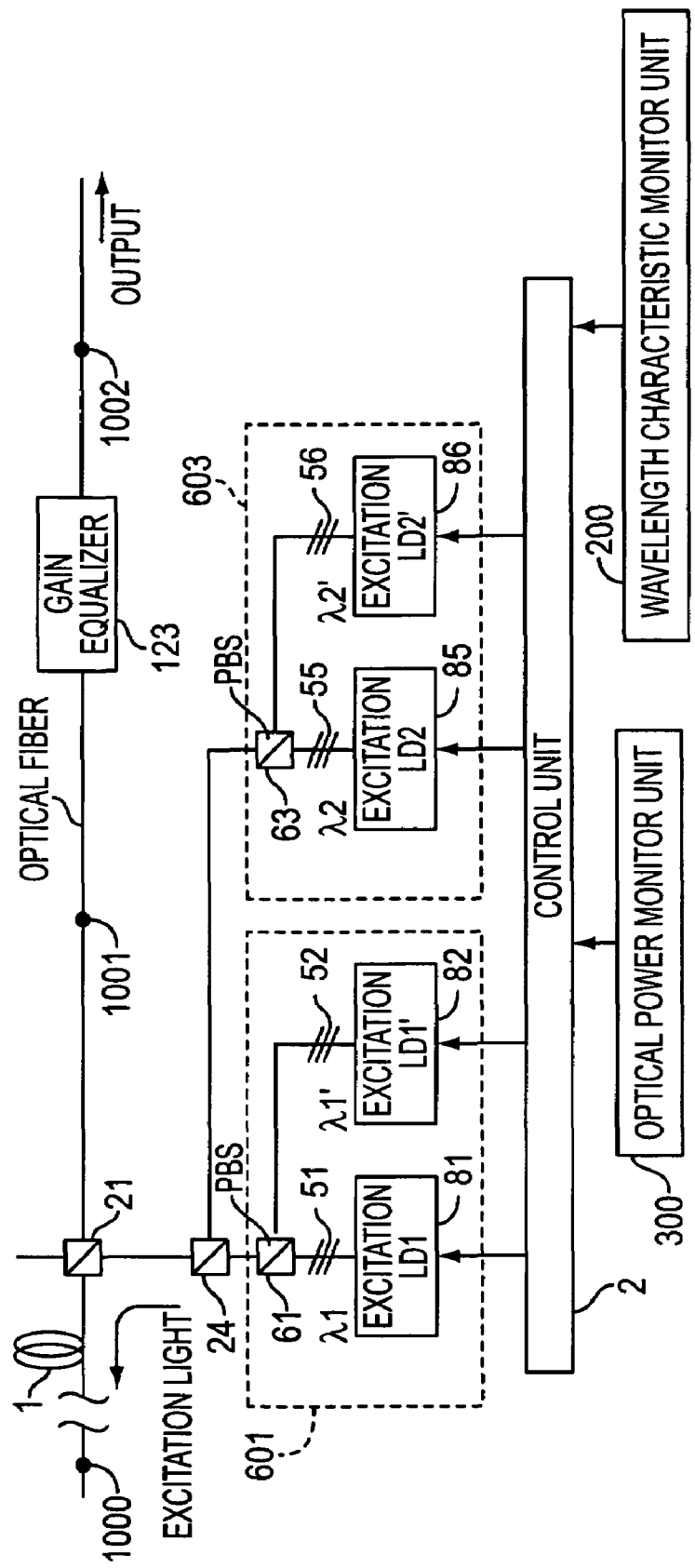

More specifically, light having the characteristics shown by FIG. 10(A) is input to the Raman amplification medium part on transmission line 1, at point 1000 in FIG. 10(E). FIG. 10(A) shows that the light of longer wavelengths have higher power than those of shorter wavelengths due to a Raman scattering effect in transmission line 1.

As shown in FIG. 10(E), the excitation light from light sources 81, 82, 85, and 86 are combined polarization right-angle by polarization couplers 61 and 63 respectively. WDM coupler 24 multiplexes the wavelengths of the excitation light. The excitation light is supplied to transmission line 1, and produces the Raman amplification gains at approximately point 1001 in FIG. 10(E), with the profiles shown by FIG. 10(B). The excitation light is output from WDM coupler 21.

The profile of Raman amplification gain caused by an excitation light has one gain peak. The wavelength corresponding to the gain peak varies depending on the wavelength of light output from different excitation light source. When multiple profiles of Raman amplification gains having different peak wavelengths are made overlapping, the total profile of Raman gains has bumpy gain characteristics in relation to the wavelengths. The total profile of Raman gains in this example has four gain peaks because four light sources of different wavelengths are used.

As shown in FIG. 10(E), the light output from WDM coupler 21 is input to a gain equalizer 123. Gain equalizer 123, which might include, for example, an optical filter, has insertion loss characteristics shown by FIG. 10(C).

Therefore, gain equalizer 123 has proper insertion loss characteristics to cancel the bumpy characteristics of the total profile of Raman amplification gains produced in transmission line 1 and obtain linear characteristics in relation to wavelengths. Thus, gain equalizer 123 can change the Raman dispersion characteristics caused according to wavelengths in transmission line 1 and the uneven gain characteristics caused by multiple beams of excitation light to linear characteristics at point 1002 in FIG. 10(E), as shown by FIG. 10(D).

The gain characteristics shown by FIG. 10(D) indicate that the gain is linearly at the same level even when the wavelength is changed. However, gain equalizer 123 can use an optical filter having a linear characteristic tilted at a certain angle. In this case, the characteristics of gain equalizer 123 can be selected or the output power and wavelengths of excitation light can be controlled on the basis of the values detected by power monitor unit 300 and wavelength characteristic monitor unit 200.

The beam splitter to branch light to power monitor unit 300 and wavelength characteristic monitor unit 200 can be located before WDM coupler 22 or between WDM couplers 21 and 2A if the beam splitter is located after WDM couplers 21.

Gain equalizer 123 can use, for example, a fiber grating filter, dielectric multilayer, or Fabry-Perot etalon filter. Moreover, gain equalizer 123 can consist of one of or a combination of the above filters.

Figure 11:
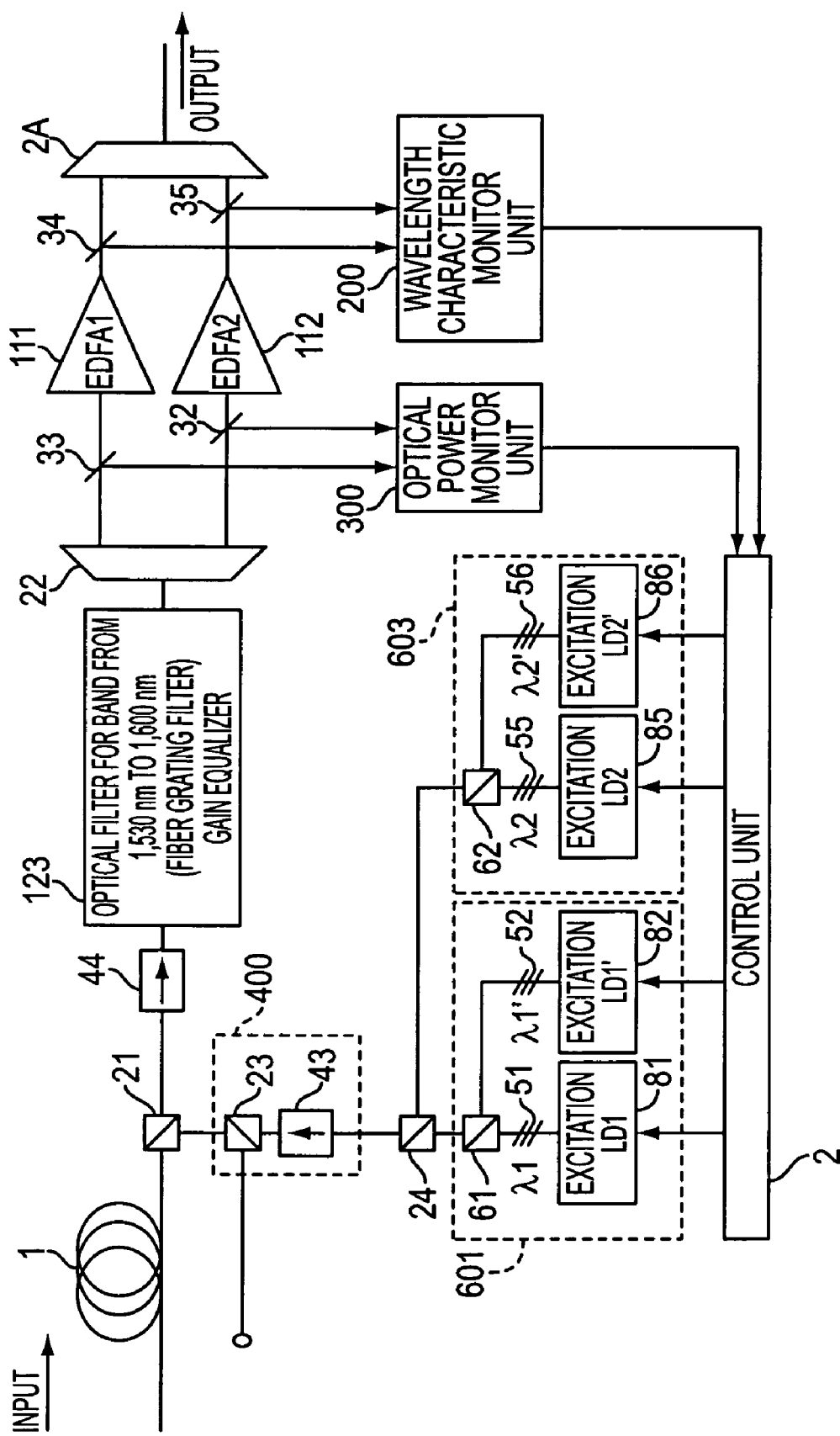
FIG. 11 is a diagram showing a Raman amplifier, according to an embodiment of the present invention.

FIG. 11 shows an example of combining the principle shown in FIG. 10 with a configuration using a Raman amplifier as the transmission line, EDFA1 for a wavelength band from 1,530 to 1,560 nm, and EDFA2 for a wavelength band from 1,570 to 1,600 nm. In FIG. 11, the components common to those shown in FIGS. 1, 4, and 10 are indicated by the same numbers as in FIGS. 4 and 10 and are not explained below.

The configuration shown in FIG. 11 has gain equalizer 123 connected between the Raman amplifier and WDM coupler 21. Beam splitters 32 and 33 are connected before optical amplification units 111 and 112, respectively. The optical power in the gain wavelength band of each optical amplification unit is measured by power monitor unit 300. Beam splitters 34 and 35 are connected after optical amplification units 111 and 112, respectively. The wavelength characteristics in the gain wavelength band of each optical amplification unit is measured by wavelength characteristic monitor unit 200. In FIG. 11, beam splitters 34 and 35 are connected after optical amplification units 111 and 112. However, beam splitters 34 and 35 can be located anywhere between WDM couplers 21 and 2A.

Control unit 2 performs control according to the wavelength bands of optical amplification units 111 and 112 on the basis of the data monitored by power monitor unit 300 and wavelength characteristic monitor unit 200 so that gain equalizer 123 (including, for example, an optical filter) can give the light the linear gain characteristics in relation to wavelengths or tilted linear gain characteristics.

Optical isolator 44 is recommended to be connected before gain equalizer 123 to prevent the light from returning from gain equalizer 123 to the Raman amplifier (transmission line 1). If gain equalizer 123 includes a fiber grating filter that was made by chirp method, the optical isolator should be used. If gain equalizer includes a fiber grating filter that does not cause return light, the optical isolator is not necessary. Optical isolator 44 must have the characteristics to pass at least the light in the wavelength band of gain equalizer 123 (which covers the gain bands of optical amplification units 111 and 112). Thus, optical isolator 44 has a band, for example, from 1530 nm to 1600 nm.

Figure 12:
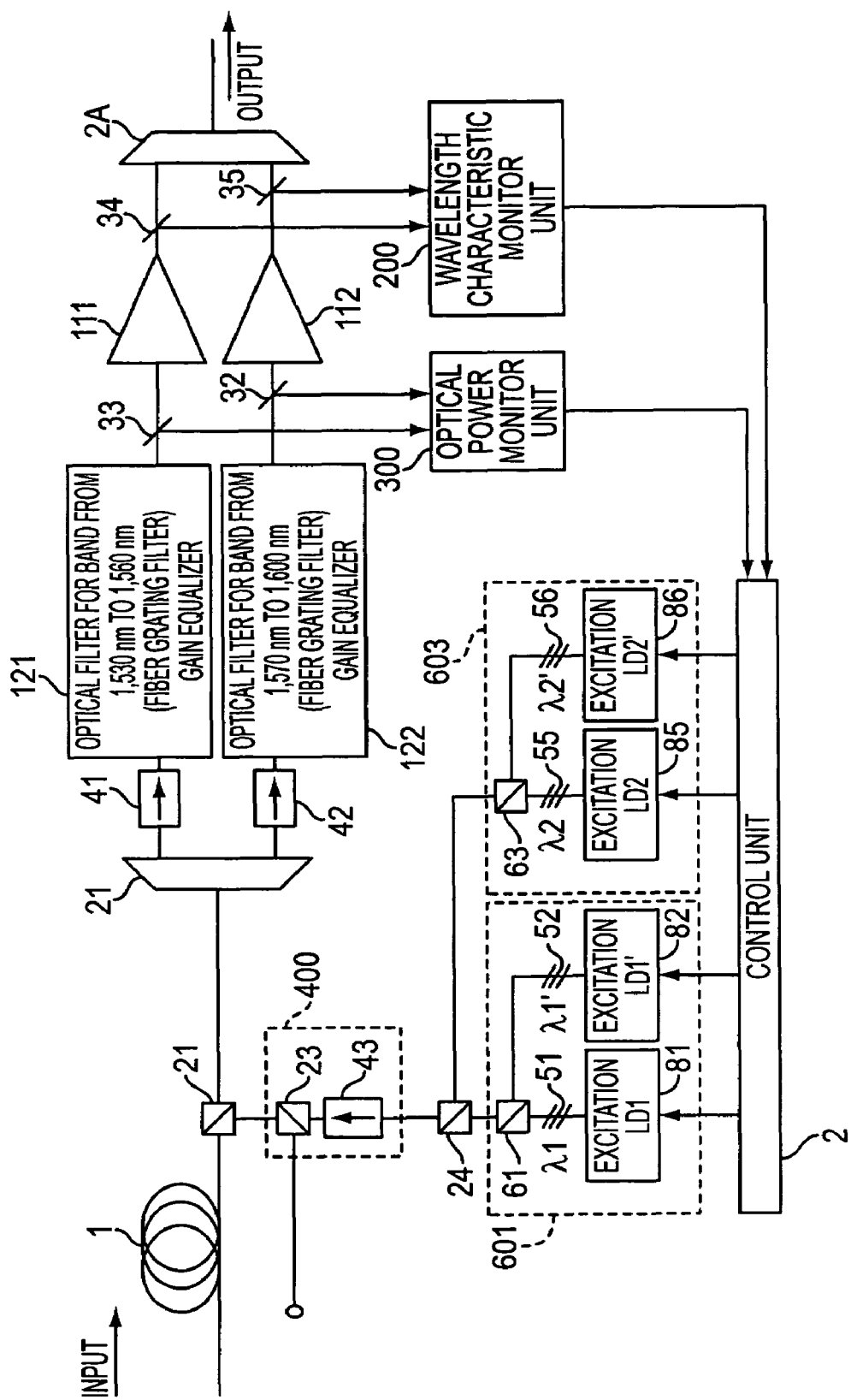
FIG. 12 is a diagram showing a Raman amplifier, according to an embodiment of the present invention.

Similar to the embodiment shown in FIG. 1, the configuration shown in FIG. 12 has optical amplification units 111 and 112 between WDM couplers 21 and 2A. The gain equalizers and monitors corresponding to the bands of the optical amplification units are connected between WDM couplers 21 and 2A.

The configurations shown in FIG. 1 and 12 are different in the number of excitation light sources. The configuration shown in FIG. 12 has the excitation light source units corresponding to the gain wavelength bands of individual optical amplification units. Other components are the same as those of the configuration shown in FIG. 1, and are not explained here.

Figure 13:
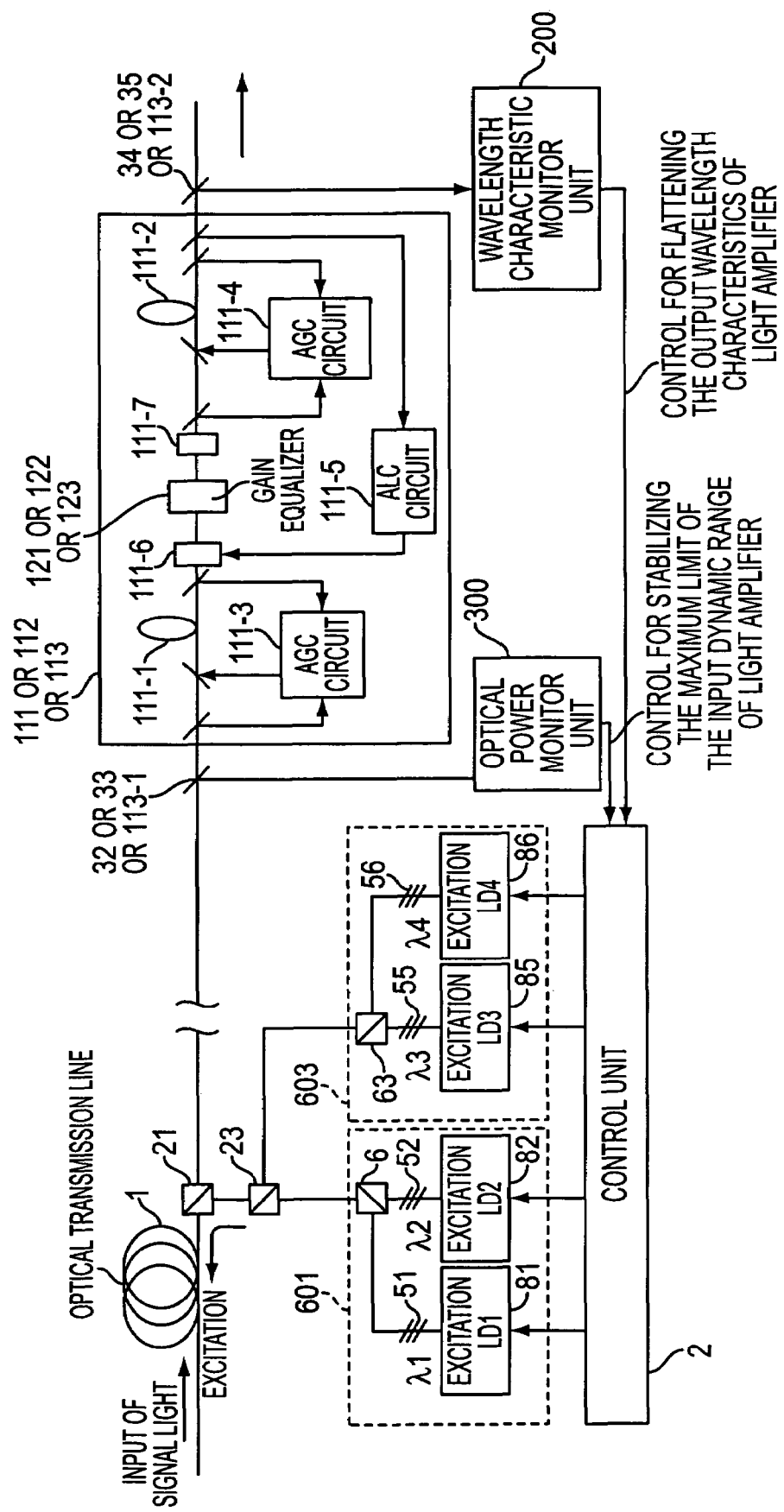
FIG. 13 is a diagram showing a Raman amplifier, according to a further embodiment of the present invention.

FIG. 13 shows an example of the configuration in which the gain equalizer is located in an optical amplification unit. In FIG. 13, the components common to those shown in FIGS. 1, 2, and 4 are indicated by the same numbers as in FIGS. 1, 2, and 4, and are not explained below.

The configuration shown in FIG. 13 may have a single optical amplification unit 113 as shown in the figure if the amplification gain band is broad, or have multiple optical amplification units that are assigned to divided gain bands as in the examples (optical amplification units 111 and 112) shown in FIGS. 1 and 4.

The basic configuration of optical amplification units is, for example, the configuration shown in FIG. 2 in which two EDFs are connected. In the basic configuration, a variable attenuator 111-6, a dispersion compensator 111-7, and gain equalizer 121, 122, or 123 to equalize the Raman amplification gain in transmission line 1 are connected between two EDFAs.

Gain equalizers 121 and 122 have the same characteristics as those of the gain equalizers shown in FIG. 12 to eliminate the distortion of Raman gain profiles caused in transmission line 1 according to the gain bands of optical amplification units 111 and 112. Gain equalizer 123 has the same characteristics as those of the gain equalizer shown in FIG. 11 to eliminate the distortion of Raman gain profiles caused in transmission line 1.

Gain equalizers 121, 122, and 123 can be those which not only eliminate the distortion of Raman gain profiles according to the gain bands of optical amplification units but also have loss (or gain) wavelength characteristics to compensate for the EDF gain/wavelength characteristics in the optical amplification units.

Gain equalizers 121, 122, and 123 can be located anywhere between the EDFs in the optical amplification units. When gain equalizers 121, 122, and 123 are located between the EDFs in the optical amplification units, noise can be lowered because the light is amplified in the first EDFA. To minimize the noise, each gain equalizer can be connected after variable attenuator 111-6 which adjusts the output from optical amplification unit as shown in FIG. 13.

Figure 14:
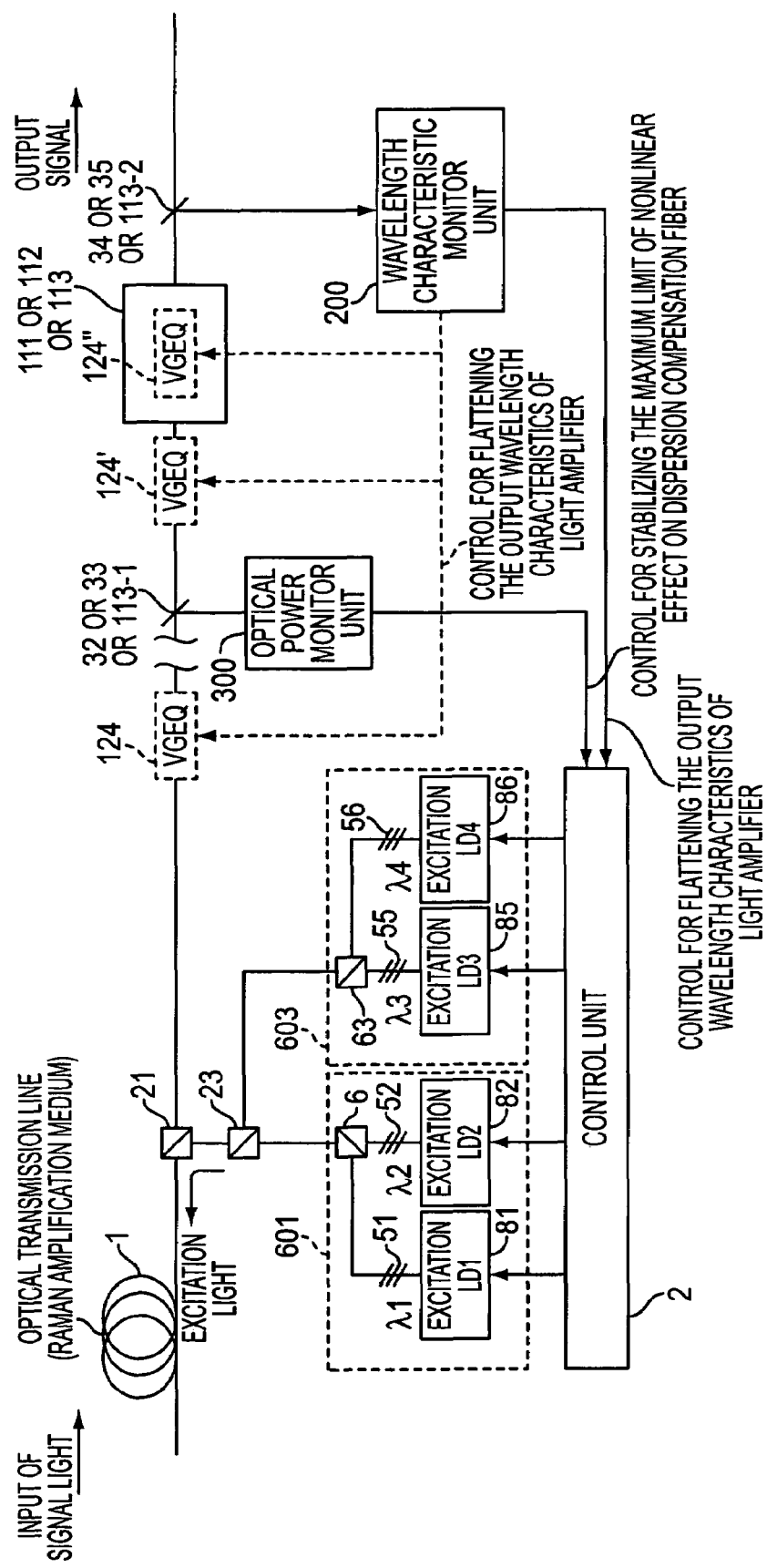
FIG. 14 is a diagram illustrating a Raman amplifier, according to an additional embodiment of the present invention.

FIG. 14 shows an example of a configuration to enable expansion of gain control range by varying the gain equalization characteristics of gain equalizer. For the explanation common to the configurations shown in FIGS. 11 to 13, three gain equalizers (VGEQ) 124, 124', and 124" are shown in FIG. 14. Gain equalizer 124 corresponds to the gain equalizer in the configuration shown in FIG. 11, gain equalizer 124' corresponds to the gain equalizer in the configuration shown in FIG. 12, and gain equalizer 124" corresponds to the gain equalizer in the configuration shown in FIG. 13. Other components in FIG. 14 are the same as those in FIGS. 11 to 13.

Bumpy characteristics of Raman gains caused by multiple excitation lights are usually equalized by gain equalizers. In addition, control unit 2 controls the output power and wavelength of each excitation light source on the basis of the data monitored by wavelength characteristic monitor unit 200 so that linear gain characteristics in relation to wavelengths or tilted, linear gain characteristics are obtained. However, if the maximum or minimum limit of the range of excitation light source control is reached, linear, flat, or tilted characteristics cannot be obtained.

The configuration shown in FIG. 14 enables the equalization characteristics of gain equalizers 124, 124', and 124" to be varied for adjustment.

FIGS. 15(A), 15(B), 15(C), 15(D), 15(E), 15(F) and 15(G) shows a variation of the configuration shown in FIGS. 10 and 11. The configuration shown in FIGS. 10 and 11 has gain equalizer 123 which is connected after the Raman amplification medium (transmission line 1) to control Raman amplification characteristics. In the configuration shown in FIG. 15(G), gain equalizer 123 is connected to the transmission line at a position before a Raman gain is produced in transmission line 1 or at transmission line 1 where a Raman gain is produced so that the wavelength characteristics of the gain produced in transmission line 1 by Raman amplification light source 600 can be compensated in a preceding step.

Figure 15G:
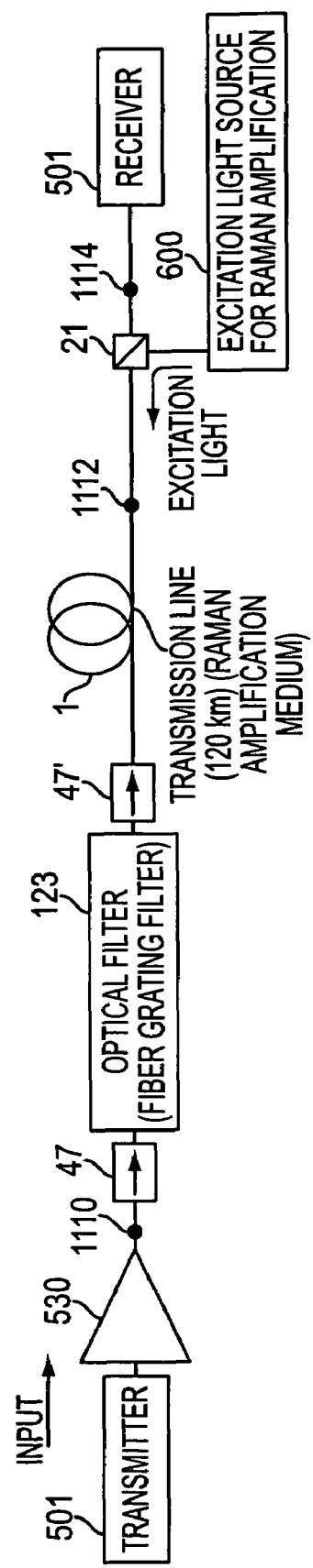

Referring now to FIG. 15(G), the wavelength multiplexed optical signal sent from a transmitter 501 is input into the repeater and amplified by optical amplification block 530, which includes an EDFA, so that it has the gain/wavelength characteristics at point 1110 as shown by FIG. 15(A).

The light amplified by an optical amplification block 530 is input to gain equalizer 123 via an optical isolator (ISO) 47. An optical filter in gain equalizer 123 has characteristics shown by FIG. 15(B). The loss characteristics of gain equalizer 123 are those which produce flat characteristics when applied to the uneven profile of Raman amplification gains caused by the multiple excitation wavelengths of excitation light source 600 for Raman amplification.

The light passing through gain equalizer 123 is input to transmission line 1 via optical isolator 47' with characteristics shown by FIG. 15(C). Transmission line 1 has the transmission loss characteristics shown by FIG. 15(D).

The profile of Raman gain at point 1112 shown by FIG. 15(E) is obtained by the input of the excitation light having multiple wavelengths from excitation light source 600 for Raman amplification to transmission line 1.

If the tilts and levels of the profile of Raman gain in FIG. 15(E) and transmission loss characteristics in FIG. 15(D) are the same, flat gain characteristics as shown in FIG. 15(F) can be obtained at point 1114 in FIG. 15(G).

Excitation light source 600 for Raman amplification in FIG. 15(G) is able to use the same configuration as the configuration of WDM coupler 21 and subsequent components that generate excitation light shown in FIGS. 1, 4, and 6 to 9.

FIGS. 16(A), 16(B), 16(C), 16(D), 16(E), 16(F) and 16(G) show an example of a repeater configuration which performs optical amplification by Raman amplifiers and EDFAs against uneven characteristics in the profile of Raman amplification gain caused by the excitation light source for Raman amplification. The wavelengths of the excitation light for Raman amplification are shifted form each other to obtain flat characteristics at the receiver. In FIG. 16(A), the components common to those shown in FIG. 15 are indicated by the same numbers as in FIG. 15 and are not explained below. Moreover, FIG. 16(A) shows EDFAs 531.

FIGS. 16(B), 16(C) and 16(D) show characteristics at points 1120, 1122 and 1124, respectively, in FIG. 16(A), when excitation light sources 600 for Raman amplification in repeaters 530-1 to 530-3 input the excitation light of different wavelengths to transmission lines 1-1 to 1-3. In these figures, each excitation light source inputs the light of a single wavelength.

The characteristics shown by FIG. 16(B) is obtained when excitation light source 600 for Raman amplification in repeater 530-1 inputs the light of wavelength λ1 to transmission line 1-1. Excitation light source 600 for Raman amplification in repeater 530-2 inputs the light of wavelength λ2 which is different from the excitation wavelength for repeater 530-1 to transmission line 1-2. In transmission line 1-2, the characteristics shown by FIG. 16(C) can be obtained as a sum of the gain characteristics produced in transmission lines 1-1 and 1-2.

Excitation light source 600 for Raman amplification in repeater 530-3 inputs the light of wavelength λ3 which is different from the excitation wavelengths for repeaters 530-1 and 530-2 to transmission line 1-3. In transmission line 1-3, the characteristics shown by FIG. 16(D) can be obtained as a sum of the gain characteristics produced in transmission lines 1-1, 1-2, and 1-3.

The total characteristics of FIG. 16(D) indicate that the characteristics become flatter as the excitation light of different wavelengths are input to the transmission line by different repeaters closer to receiver 502.

FIGS. 16(E), 16(F) and 16(G) show characteristics at points 1120, 1122 and 1124, respectively, in FIG. 16(A), when excitation light sources 600 for Raman amplification in repeaters 530-1 to 530-3 input the excitation light of different wavelengths to transmission lines 1-1 to 1-3. In FIGS. 16(E), 16(F) and 16(G), each excitation light source inputs the light of multiple wavelengths that are different among repeaters. The total characteristics of FIG. 16(G) indicate that the characteristics are flatter than the total characteristics (a-3).

The configuration shown in FIG. 16(A) can be the same as the configuration of WDM coupler 21 and subsequent components that generate excitation light shown in FIGS. 1, 4, and 6 to 9. Also, the configuration shown in FIG. 16(A) can be combined with the filters in the configurations shown in FIGS. 10 to 15 for adjustment of Raman gain characteristics.

Figure 17:
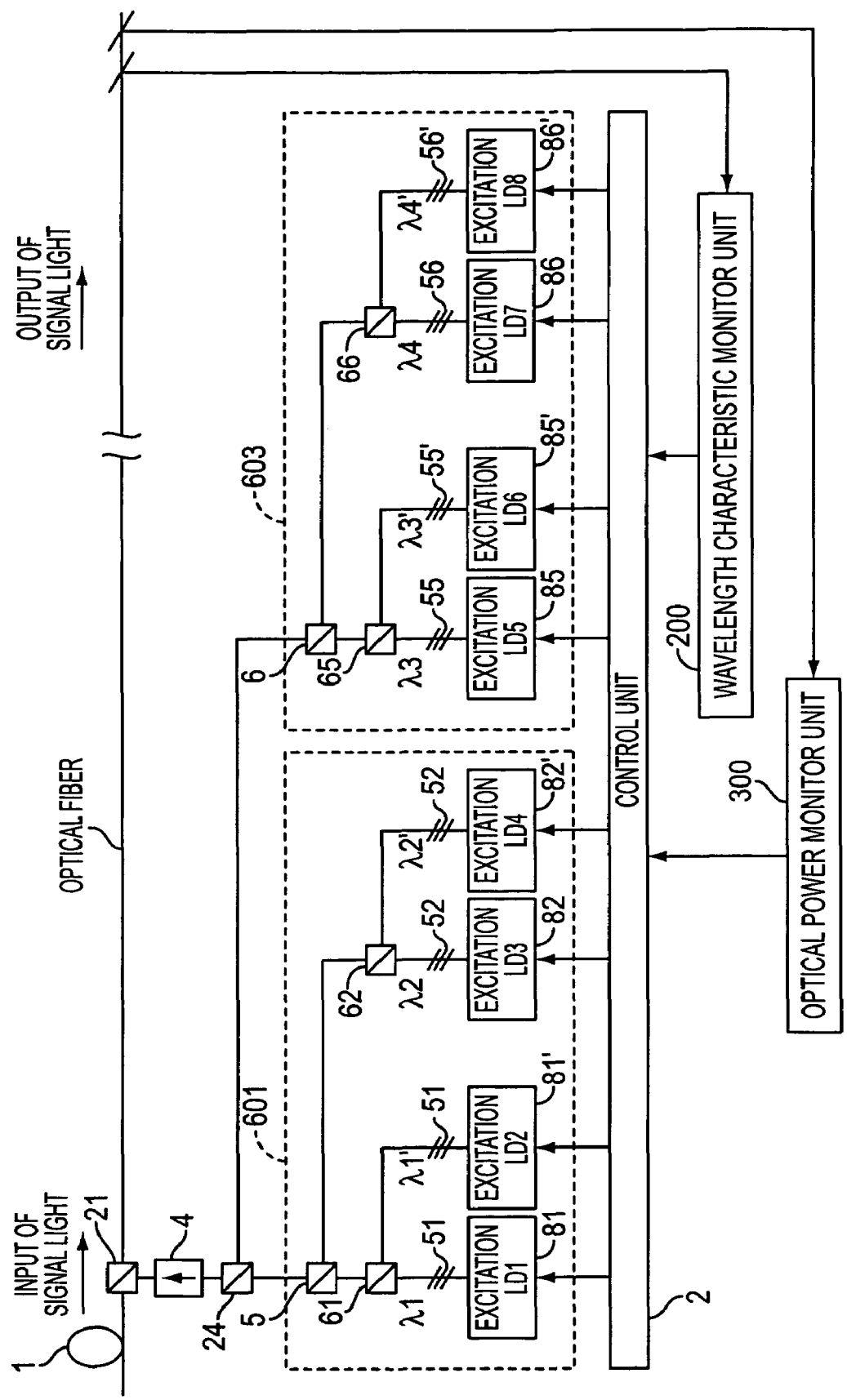
FIG. 17 is a diagram showing a Raman amplifier, according to an embodiment of the present invention.
Figure 18:
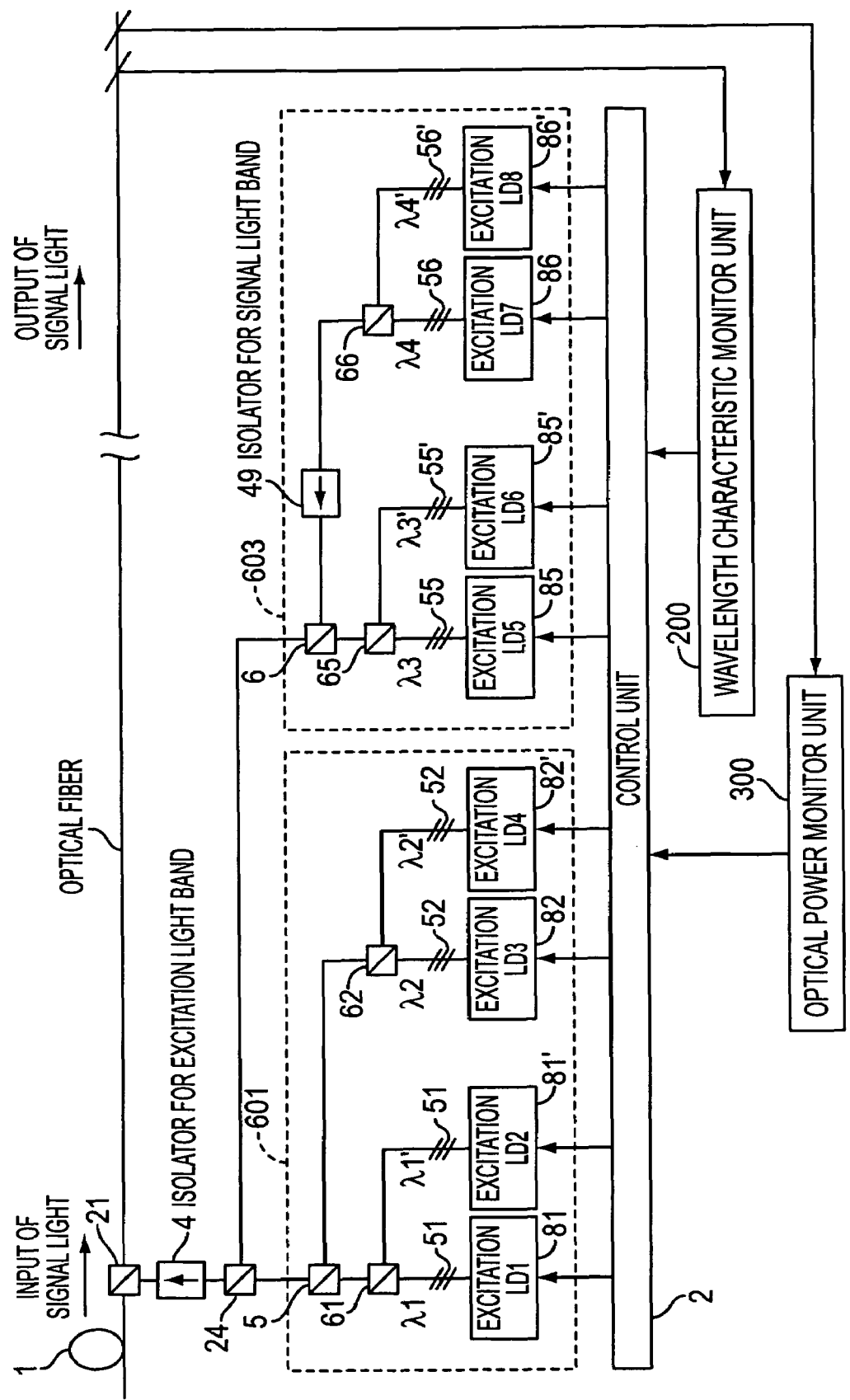
FIG. 18 is a diagram showing a Raman amplifier, according to a further embodiment of the present invention.
Figure 19:
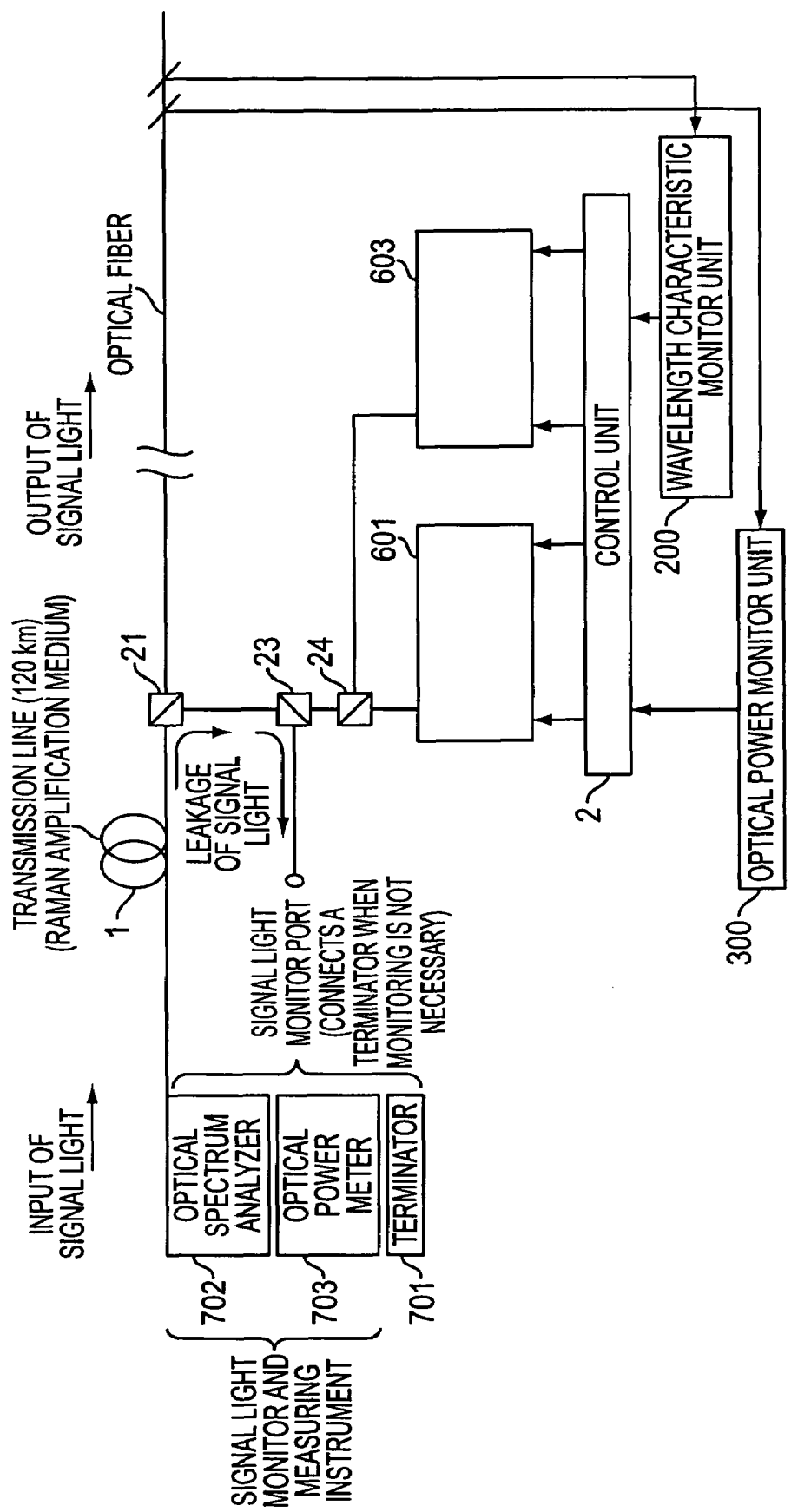
FIG. 19 is a diagram showing a Raman amplifier, according to a still further embodiment of the present invention.

As additional embodiments of the present invention, an optical device can be used to prevent the excitation light for Raman amplification from returning from the transmission line and a signal light leakage from WDM coupler 21 from being sent to excitation light sources. FIGS. 17 to 19 relate to such embodiments.

For example, FIG. 17 shows the configuration of the excitation light source system for Raman amplification connected after WDM coupler 21. In this configuration, an optical isolator 4 is connected between WDM couplers 21 and 24. Optical isolator 4 passes the light transmitted from WDM coupler 24 to WDM coupler 21, but interrupts the light transmitted from WDM coupler 21 to WDM coupler 24. Optical isolator 4 thus prevents the excitation light input to transmission line 1 from returning to excitation light sources because of dispersion or for other reasons and the signal light from being sent toward excitation light sources because of crosstalk on WDM coupler 21. Connecting optical isolator 4 in this position is an economical method without the need to mounting an optical isolator for each excitation light source.

FIG. 18 shows an example of the configuration in which optical isolator 4 is used in consideration of its wavelength characteristics. The difference of the wavelengths of excitation light and signal light is about 100 nm. If there is no optical isolator for a broad wavelength band that can cover this difference of wavelengths, the configuration shown in FIG. 18 can be used. In this configuration, optical isolator 4 is used to isolate the light of excitation wavelengths and an optical isolator 49 interrupting the light of signal light wavelengths is used to prevent the signal light from being sent toward excitation light sources because of cross-talk on WDM coupler 21. Optical isolator 49 is connected at the port to which the signal light of the wavelengths (the light having longer wavelengths) with the characteristics of WDM coupler 24 returns.

FIG. 19 shows an example of the configuration in which signal light cross-talk from WDM coupler 21 is fetched and used as monitor data to prevent the signal light from being sent toward excitation light sources because of cross-talk on WDM coupler 21. WDM coupler 23 has wavelength characteristics to reflect the light in the signal light wavelength band and output it to the monitor port. A terminator 701 is usually attached to the monitor port to terminate the signal light. If it is necessary to monitor the status of signal light, a spectrum monitor 702 or an optical power meter 703 is connected to the monitor port.

In the configurations shown in FIGS. 17 to 19, optical devices are used to prevent the light from returning to excitation light sources because of Rayleigh scattering of excitation light, leakage of signal light, or cross-talk on a WDM coupler. Thus, the operation of excitation light sources can be made consistent and the deterioration of light can be avoided. The configurations shown in FIGS. 17 to 19 can be applied to the excitation light source systems shown in FIGS. 1, 4, 6 to 16, 20, 23, and 24.

Optical communication systems differ from one another in the type of transmission line (e.g., mode field diameter and insertion loss), power of signal light input, and length of transmission line. The gain characteristics required for a Raman amplifier by an optical communication system depends on the individual optical communication system.

It is necessary to set up the excitation wavelengths for Raman amplification and the interval of wavelengths for each optical communication system.

Figure 20:
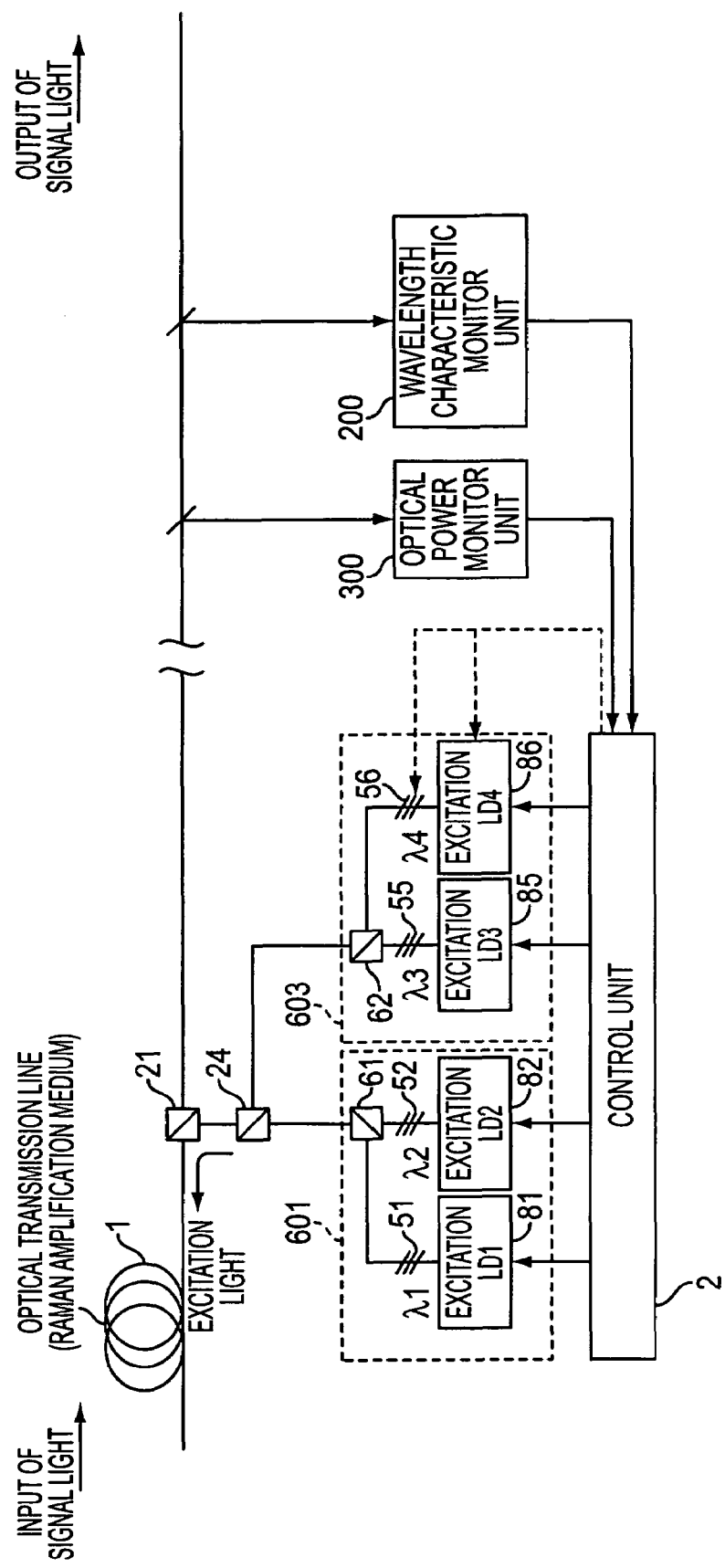
FIG. 20 is a diagram showing a Raman amplifier, according to an additional embodiment of the present invention.

FIG. 20 shows an example of a configuration in which the operation temperature of a semiconductor laser operating as light source 86 is changed by an output from control unit 2 to vary the oscillating wavelength. The center wavelength is generally changed according to changes in operation temperature at a rate around 0.45 nm/° C. For example, if the operation temperature is changed by 10° C., the center wavelength of excitation light is changed by 4.5 nm. If the operation temperature can be controlled in this manner, the gain/wavelength characteristics of Raman amplification can be controlled.

The oscillating wavelength can also be varied by giving temperature control or stress to fiber brag grating filter 56 for external resonance, which is connected on the output side of the semiconductor laser. On fiber brag grating filter 56, the center wavelength is changed according to changes in operation temperature at a rate of typically around 0.01 nm/° C.

Wavelength control can be done on light source 86 and fiber brag grating filter 56 individually or in combination.

In the configuration shown in FIG. 20, wavelength control is done on fiber brag grating filter 56. The light source and external resonance device for any wavelength can be selected as the control target, or multiple light sources covering all wavelengths and multiple external resonance devices covering all wavelengths can be controlled. In the case of a Raman amplifier using the excitation light of multiple wavelengths as the one shown in FIG. 20, the configuration and control to vary oscillating wavelength are recommended to be applied to the excitation light source of which the center wavelength is longer than those of other excitation light sources.

The reason for the above recommendation lies in the loss/wavelength characteristics of transmission line 1, Raman scattering effect, and the shape of Raman gain profile as explained below.

Figure 21:
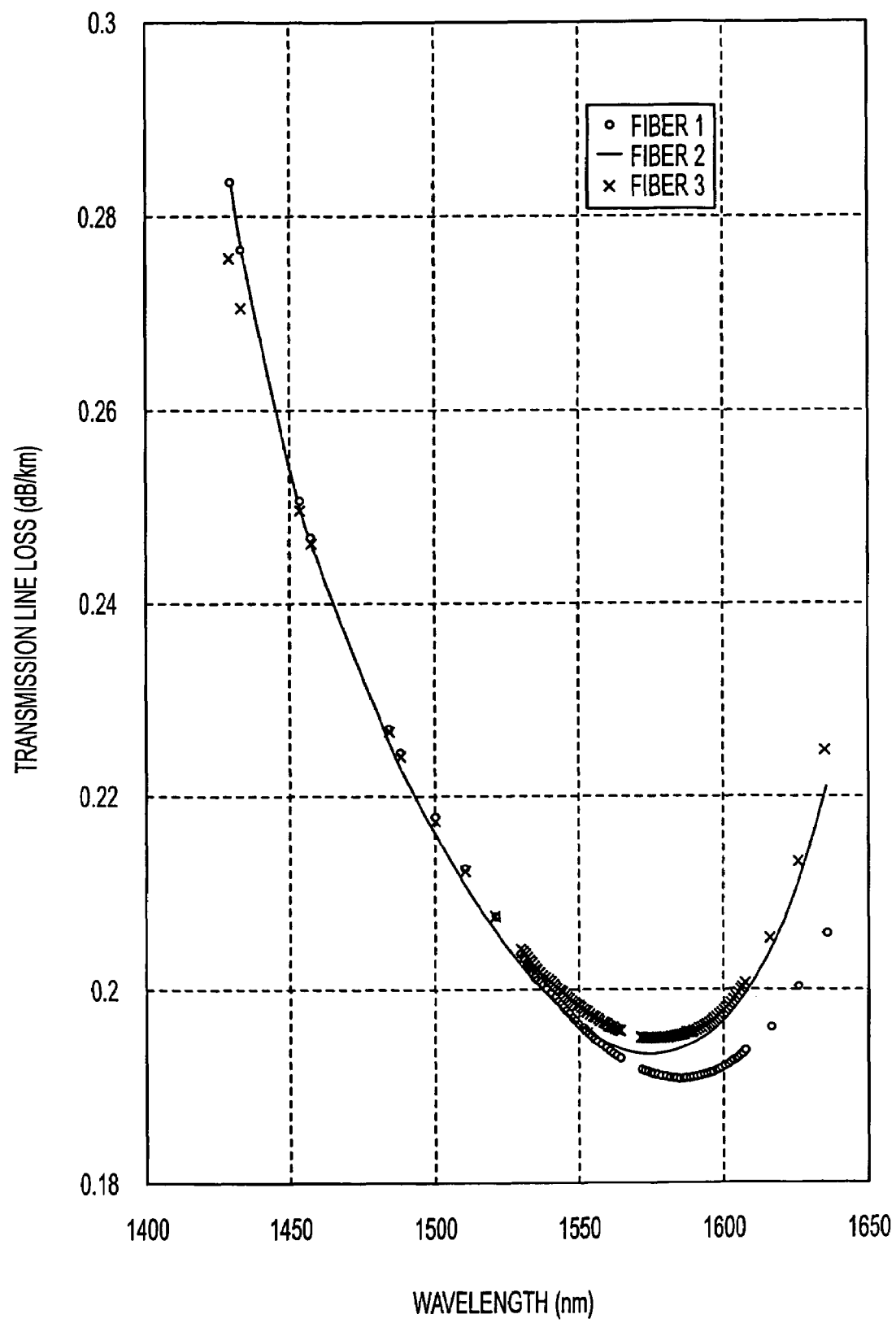
FIG. 21 is a diagram showing a characteristic of transmission lines, according to an embodiment of the present invention.

FIG. 21 shows the loss/wavelength characteristics of the three types of transmission line (optical fiber) which are different in mode field diameter and wavelength dispersion value. As shown in FIG. 21, the difference in loss tends to be larger as the wavelength is longer. Also, the difference in Raman scattering effect caused in the transmission line tends to be larger as the wavelength is longer although the size of the effect depends on input conditions and transmission line length.

Regarding the shape of the profile of Raman amplification gain, the gain curve tends to show a steeper gradient on the longer wavelength side of the peak of gain in comparison with the section on the shorter wavelength side. For this reason, the profile of Raman amplification gain in the longest wavelength band has a least section overlapping the profile of the gain caused by the light in other wavelength band, and the Raman amplification in the longest wavelength band produces the gain by almost a single wavelength. Thus, there can be less freedom of adjusting gain/wavelength characteristics with multiple wavelengths.

For the reason described above, gain conditions can be set up most effectively by controlling excitation light wavelengths on the light sources for longer wavelengths. By the use of this control method, the optical amplifier can be designed to conform to different types of optical communication systems.

If both the output power of excitation light source and wavelengths of excitation light can be controlled, the Raman amplifier will be that can flexibly meet varied system conditions.

Figure 22:
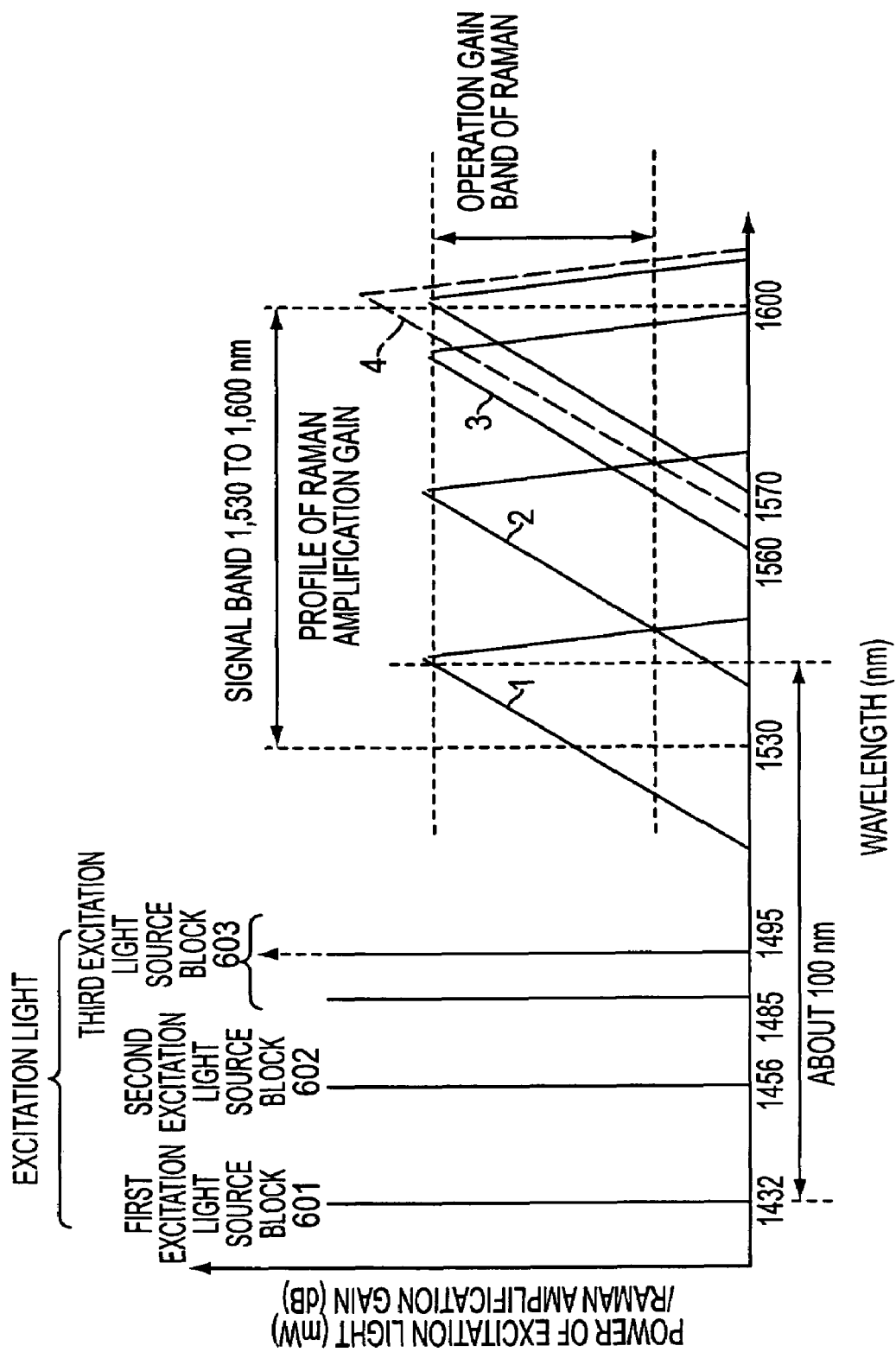
FIG. 22 is a diagram showing a Raman gain profile, according to an embodiment of the present invention.

FIG. 22 shows an example of controlling the power of excitation light on the excitation light source units for longer wavelengths by using the excitation light sources for longer wavelengths. When the wavelength band of excitation light are divided into the wavelengths at an interval narrower than the interval of wavelengths on other excitation light sources and the ratio of the power of the excitation light having the divided wavelengths is varied, the center gravity wavelength among oscillating wavelengths can be varied much easily. Controllability can also be improved when a fiber Brag grating filter for external resonance is connected on the output side of the semiconductor laser and its oscillating wavelength is fixed.

The following explains the method of controlling Raman amplification gain in an amplification system that performs Raman amplification by excitation light in transmission line 1 then amplifies the light by an optical amplification unit consisting of EDFAs.

In the configurations shown in FIGS. 1, 4, 11, 12 to 14, and 16 in which a Raman amplifier is connected on the input side of EDFA, the following control operations are enabled if the main signal light is partly branched and monitored by power monitor 300 and wavelength characteristic monitor 200 and the power of the excitation light having multiple wavelengths is controlled by control unit 2:

(1) Control unit 2 controls the wavelength characteristics of signal light caused by the Raman scattering effect in transmission line 1 so that they become flat.

To compensate for the Raman scattering effect in transmission line 1, the system should be designed appropriately so that the power of the excitation light having shorter wavelengths can be increased on the relevant excitation light sources.

The light with high flatness of wavelength characteristics can be input to the optical amplification unit if the number of the excitation light sources for shorter wavelengths, the light sources that can output higher power of light when compared with those for longer wavelengths are used, and gains and gain/wavelength characteristics of Raman and optical amplifiers are controlled on the basis of the data monitored by power monitor 300 and wavelength characteristic monitor.

(2) Control unit 1 controls the power of the light input to the EDFAs in optical amplification units 111 to 113 so that the power is consistent and not more than the maximum limit of the input dynamic range of each EDFA.

If optical amplification units 111 to 113 with EDFs input the light of which the power exceeds their input dynamic range, optical signal-to-noise ratio for optical amplification is lowered. For this reason, a factor of better transmission characteristics in an optical communication system is to perform Raman amplification within the input dynamic ranges of optical amplification units 111 to 113.

If the light input from Raman amplifier is stabilized at a certain level by gain stabilizing control on optical amplification units 111 to 113, their dynamic ranges are practically expanded while the signal-to-noise ratio is kept to be high. Gain constant control or output power constant control or the both should be given to the EDFAs in optical amplification units 111 to 113.

Thus, the transmission characteristics of an optical communication system can be improved in consideration of the noise characteristics of optical amplifiers.

(3) Control unit 2 controls the Raman amplification gain produced in transmission line 1 so that the light input to the optical amplification units using EDFAs is always at a specified level.

Figure 23:
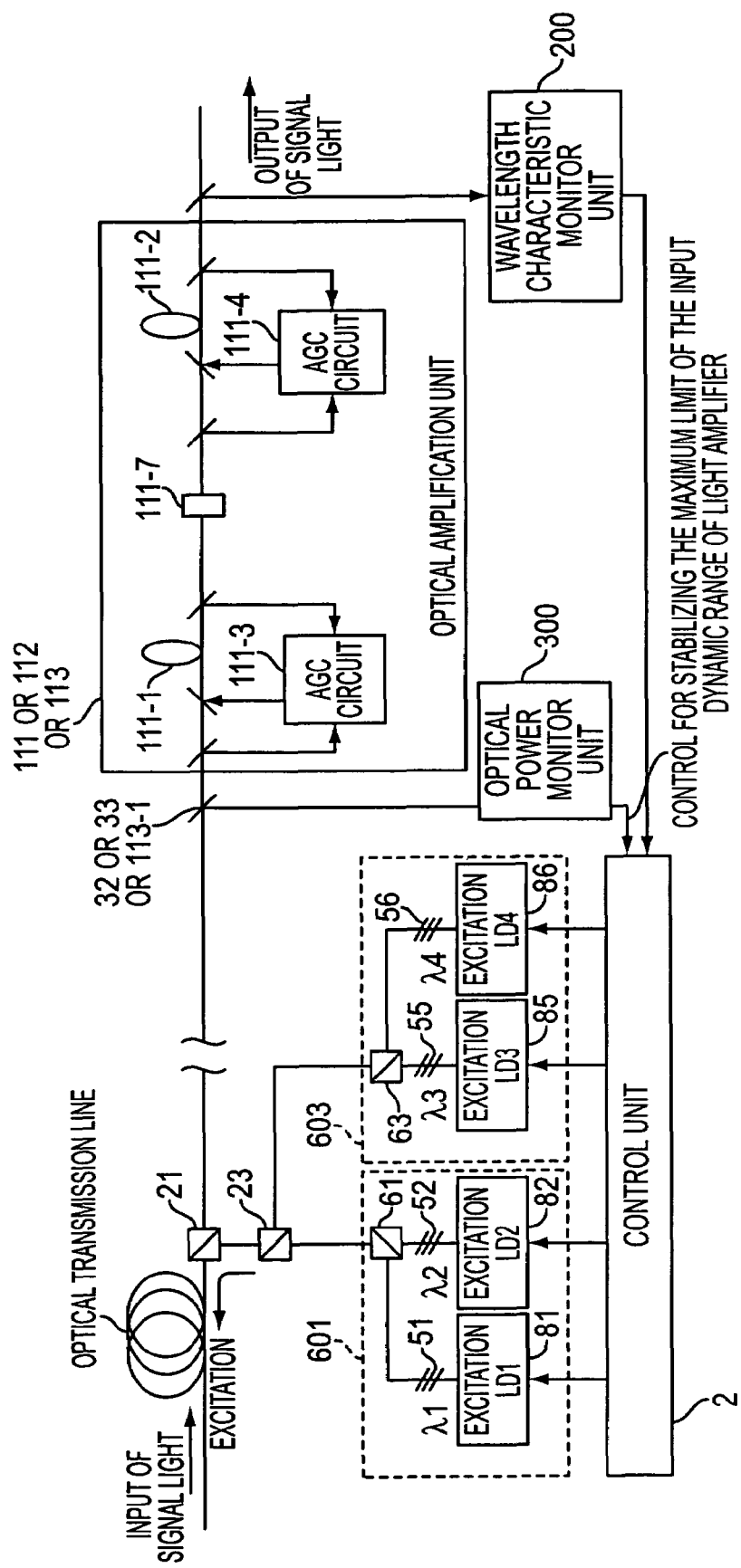
FIG. 23 is a diagram showing an optical amplifier, according to an embodiment of the present invention.

FIG. 23 shows an example of the configuration in which the level stabilizing control is done for the light input to the optical amplification units. In FIG. 23, the components common to those shown in FIGS. 2 and 13 are indicated by the same numbers as in FIGS. 2 and 13 and are not explained below.

Gain constant control is done for each EDF because the wavelength characteristics of EDF vary depending on the gain. To prevent the output from the EDFA for which gain constant control is done from being changed when the input to EDFA is changed, the outputs power from optical amplification units 111 to 113 are controlled by variable optical attenuator 111-6 so that outputs power are constant. In the configuration shown in FIG. 23, the input to each EDFA is stabilized by the Raman amplification in transmission line 1 based on the data monitored by optical power monitor unit 300 and wavelength monitor unit 200, and the output from each EDFA can be stabilized only by the gain stabilizing control on EDFA. Thus, the variable optical attenuator can be eliminated.

Figure 24:
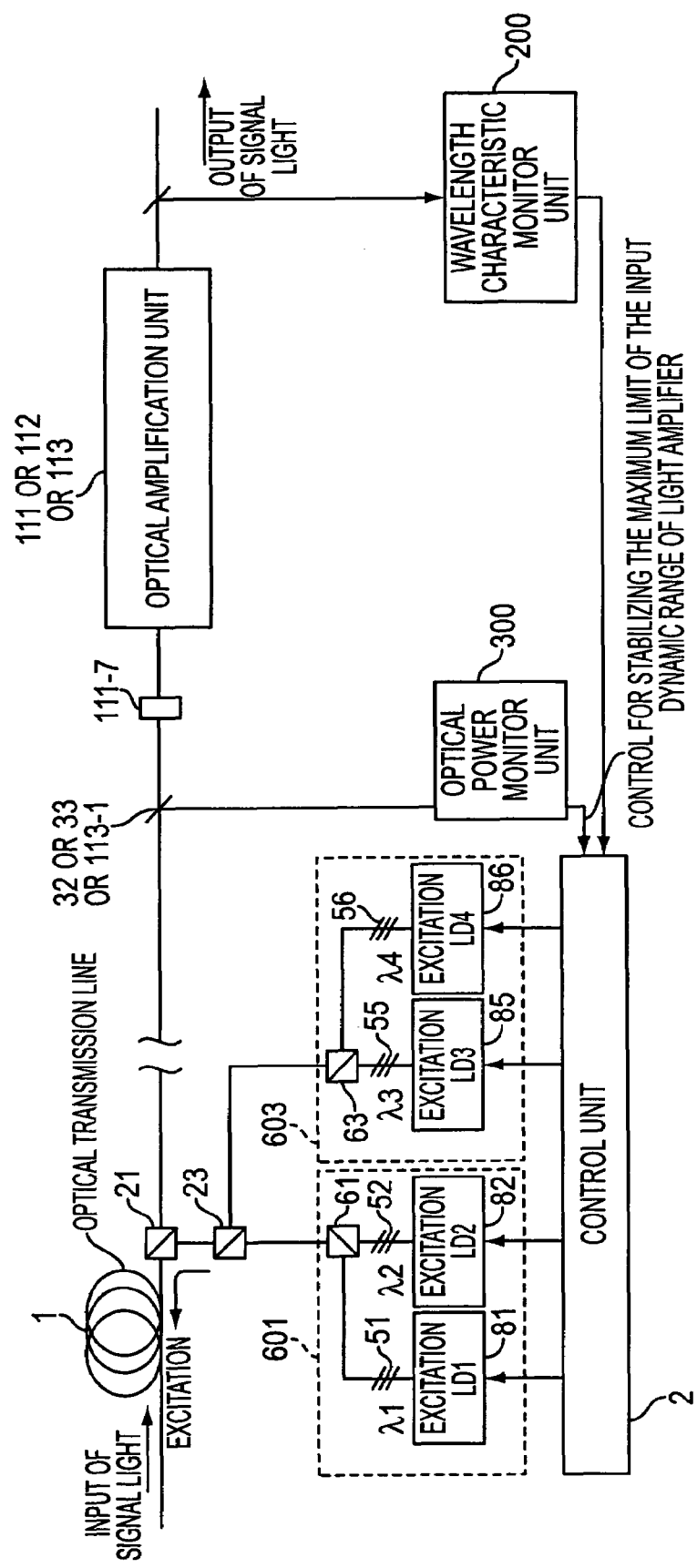
FIG. 24 is a diagram showing an optical amplifier, according to a further embodiment of the present invention.

FIG. 24 shows an example of the configuration in which the input to each EDFA is constant. The configuration shown in FIG. 24 has a dispersion compensator, which is mounted in optical amplification units, before the optical amplification units shown in FIG. 23.

Dispersion compensator 111-7 is connected between transmission line 1 where Raman amplification is done and optical amplification unit 111, 112, or 113. The Raman amplifier branches the main signal light partly, monitors the branched light, and controls the total power of the light input to the dispersion compensation filter at a specified level. This control is required because a nonlinear effect causes signal light transmission characteristics to be deteriorated if the light input to the dispersion compensation fiber exceeds the specified level.

A nonlinear effect occurs generally when the level of the light input to the dispersion compensation fiber becomes 0 dBm/channel or more. On the other hand, if the level of the light input to the dispersion compensation fiber becomes too low, the signal light is buried into the noise light and transmission characteristics are lowered because of a poor signal-to-noise ratio.

To avoid these problems, the light input to the dispersion compensation fiber is controlled at the maximum level that does not cause a nonlinear effect.

At the same time, the generation conditions (e.g., center gravity wavelength or power of excitation light) for the excitation light having different wavelengths are adjusted to control the flatness of the wavelength characteristics of signal light.

By the control operations considering the nonlinear effect and signal-to-noise ratio as explained above, the Raman amplifier and optical amplifier of single kinds can conform to the necessary characteristics (e.g., gains and gain/wavelength characteristics of Raman and optical amplifiers and dispersion compensation values) varying depending on the type of optical communication system. The Raman and optical amplifiers can also maintain the necessary characteristics, and allow expansion and adjustment of the dynamic range of EDFAs and compensation for the gain characteristics of EDFAs.

By mounting multiple excitation light sources corresponding to the amplification bands of EDFAs and controlling the outputs from the excitation light sources through embodiments of this invention, it is possible to expand the wavelength band of EDFA, compensate for the gain/wavelength characteristics of the Raman amplification using multiple beams of excitation light, prevent the light from returning from the Raman amplification medium to excitation light sources, simplify addition of the optical amplifier with a fixed wavelength band for optical amplification, adjust the dynamic range of the optical amplifier with a fixed wavelength band for optical amplification, and control gain profiles to conform to various optical communication systems different in transmission conditions (e.g., transmission line length, transmission line loss, input power, and number of signals).

This invention is related to an optical amplifier to form a broad transmission signal band when the number of multiplexed wavelengths is increased.

Various embodiments described herein relate to expanding the band of an EDFA. In various embodiments of the present invention, an optical amplifier includes a first optical amplifier which amplifies light by a plurality of excitation lights multiplexed together, a band divider which divides an output light from the first optical amplifier into multiple bands, and a plurality of second optical amplifiers which have multiple gains corresponding, respectively, to the multiple bands.

Moreover, in various embodiments described herein, an optical amplifier has a first optical amplifier which amplifies the light in a first wavelength band, a second optical amplifier which amplifies the light in a second wavelength band different from the first wavelength band, a third optical amplifier which receives multiplexed excitation lights so that light in the first wavelength band and the second wavelength band are amplified by Raman amplification in the third optical amplifier, and a wavelength band divider which divides an amplified light from the third amplifier into the first wavelength band and the second wavelength band and causes the light in the first wavelength band divided by the wavelength band divider to be input to the first optical amplifier and the light in the second wavelength band divided by the wavelength band divider to be input to the second optical amplifier.

Further, various embodiments described herein relate to control of wavelength characteristics of Raman gain produced by multiplexed excitation light. In such embodiments, an optical amplifier includes an optical fiber, sources of excitation light which produce excitation lights that cause Raman gain in the optical fiber, and a gain equalizer which compensates the wavelength characteristics of the Raman gain produced in the optical fiber by the excitation light.

Moreover, various embodiments described herein relate to preventing light from returning from the Raman amplification medium to excitation light sources. In such embodiments, an optical amplifier has an optical fiber, a plurality of excitation light sources providing excitation lights which produce a Raman gain in the optical fiber, a first optical coupler which multiplexes the excitation lights together, a second optical coupler which receives the multiplexed excitation lights from the first optical coupler and provides the multiplexed excitation lights to the optical fiber, and an optical device between the first and second optical couplers that prevents a light from the optical fiber from returning to the excitation light sources.

Various examples are described herein in which specific wavelengths are used, for example, FIG. 1 shows light sources 81, 82, 83, 84, 85 and 86 as producing light at specific wavelengths. These specific wavelengths are intended as examples, and the present invention is not limited to these specific wavelengths. Similarly, the various embodiments of the present invention described herein are not limited to the specific values for wavelengths, wavelength bands, or other values, described herein.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. An apparatus comprising:
    a dispersion compensation fiber through which a signal light travels;
    an excitation light causing a Raman gain to occur in the dispersion compensation fiber as the signal light travels through the dispersion compensation fiber, the excitation light comprising a plurality of lights having different wavelengths so that the Raman gain has a plurality of gain peaks;
    a gain equalizer through which the signal light travels, and being upstream or downstream of the occurrence of the Raman gain in the dispersion compensation fiber; and
    a controller controlling the gain equalizer to linearize the plurality of gain peaks in accordance with a monitored optical power or a monitored wavelength characteristic of linearized light output from the gain equalizer, and controlling power of the excitation light to stabilize a nonlinear effect on the dispersion compensation fiber.

2. An apparatus as in claim 1, wherein the gain equalizer equalizes the Raman gain to be substantially constant in a wavelength band.

3. An apparatus as in claim 1, wherein the signal light is a wavelength division multiplexed (WDM) light, and the linearizing of the gain peaks of the Raman gain by the gain equalizer thereby equalizes the WDM light.

4. An apparatus as in claim 1, wherein the gain equalizer is a variable gain equalizer.

5. An apparatus as in claim 1, wherein the gain equalizer is upstream of the occurrence of the Raman gain in the fiber.

6. An apparatus as in claim 1, wherein the gain equalizer is a filter.

7. An apparatus as in claim 1, wherein the gain equalizer is a fiber grating filter, a dielectric multilayer filter, a Fabry-Perot etalon filter, or any combination of these filters.

8. An apparatus as in claim 1, wherein the gain equalizer is a plurality of erbium-doped fiber amplifiers.

9. A method of optical amplifying comprising:
    Raman amplifying a signal light with a first optical amplifier in accordance with excitation light provided to the first optical amplifier, the first optical amplifier having a corresponding Raman wavelength band of gain, and the signal light include a plurality of wavelengths multiplexed together;
    amplifying amplified signal light of the first optical amplifier with a second optical amplifier having a corresponding wavelength band of gain; and
    when a number of wavelengths in the signal light is to be increased and thereby require an expansion of an amplification band provided by the first and second optical amplifiers,
        expanding the Raman wavelength band of gain of the first optical amplifier, and
        adding a third optical amplifier having a corresponding wavelength band of gain different than the wavelength band of gain of the second optical amplifier, the third optical amplifier being added in parallel with the second optical amplifier to amplify amplified signal light of the first optical amplifier.

10. A method as in claim 9, wherein said expanding expands the Raman wavelength band of the first optical amplifier by controlling the excitation light provided to the first optical amplifier.

11. A method as in claim 9, wherein the excitation light is provided to the first optical amplifier by at least one light source, and said expanding expands the Raman wavelength band of the first optical amplifier by expanding a number of light sources providing excitation light to the first optical amplifier.

12. A method as in claim 9, wherein said expanding the Raman wavelength band and said adding a third optical amplifier are performed while the first optical amplifier and the second optical amplifier are operating to amplify the signal light.

13. A method as in claim 10, wherein said expanding the Raman wavelength band and said adding a third optical amplifier are performed while the first optical amplifier and the second optical amplifier are operating to amplify the signal light.

14. A method as in claim 11, wherein said expanding the Raman wavelength band and said adding a third optical amplifier are performed while the first optical amplifier and the second optical amplifier are operating to amplify the signal light.

15. An apparatus comprising:
a first optical amplifier Raman amplifying a light in accordance with a plurality of excitation lights provided to the first optical amplifier;
a second optical amplifier receiving the amplified light and amplifying the received light; and
a detector detecting a power level of the light after being amplified by the first optical amplifier and before being received by the second optical amplifier, wherein the first optical amplifier controls the Raman amplification of the first optical amplifier in accordance with the detected power level so that the amplified light as received by the second optical amplifier is maintained to be constant,
wherein the second optical amplifier comprises:
a first amplifier having a gain in a first wavelength band, the first amplifier receiving amplified light from the first optical amplifier in the first wavelength band and optically amplifying the received light, and
a second amplifier having a gain in a second wavelength band different from the first wavelength band, the second amplifier receiving amplified light from the first optical amplifier in the second wavelength band and optically amplifying the received light, wherein the first optical amplifier controls a power level of the amplified light as received by the first amplifier and a power level of the amplified light as received by the second amplifier to be constant.

16. An apparatus comprising:
an optical amplification medium through which light travels, the optical amplification medium including, or being optically connected to, a transmission line through which the light travels;
excitation light sources providing excitation lights;
a coupler coupling the excitation lights to the optical amplification medium, the coupled excitation lights causing the light traveling through the optical amplification medium to be Raman amplified; and
a controller controlling a gain characteristic of the optical amplification medium in accordance with a detected condition of the Raman amplified light, wherein the controller controls a temperature of at least one excitation light source to control the power level of the excitation light provided by the respective excitation light source, to thereby control the gain characteristic of the optical amplification medium in accordance with the detected condition.

17. An apparatus comprising:
an optical amplification medium through which light travels, the optical amplification medium including, or being optically connected to, a transmission line through which the light travels;
excitation light sources providing excitation lights;
a coupler coupling the excitation lights to the optical amplification medium, the coupled excitation lights causing the light traveling through the optical amplification medium to be Raman amplified;
a controller controlling a gain characteristic of the optical amplification medium in accordance with a detected condition of the Raman amplified light; and
an external resonator operating in association with a respective light source for providing at least one excitation light of the excitation lights, wherein the controller controls the gain characteristic of the optical amplification medium by changing a temperature or stress of the external resonator.

18. An apparatus comprising:
an optical fiber transmission line having first and second sections, light traveling through the first section and thereafter through the second section;
a first excitation light source providing excitation light to the first section so that the light traveling through the first section is Raman amplified in the first section;
a second excitation light source providing excitation light to the second section so that the light traveling through the second section is Raman amplified in second section,
wherein the excitation light provided by the first excitation light source is at a different wavelength than the excitation light provided by the second excitation light source, and the different wavelengths cause the Raman amplification in the first and second sections taken together to be flat over a range of wavelengths at a downstream receiver;
the apparatus further comprising an optical amplifier including a rare earth doped fiber provided with excitation light by an excitation light source which is not the first or second excitation light source, the optical amplifier connected between the first and second sections so that the light travels from the first section, through the rare earth doped fiber, to the second section, and is thereby amplified in the rare earth doped fiber via the excitation light provided to the rare earth doped fiber, and
wherein the first excitation light source is in a first optical repeater, and the second excitation light source is in a second optical repeater downstream of the first optical repeater.

19. An apparatus as in claim 18, wherein
the first excitation light source comprises a plurality of excitation light sources providing excitation lights to the first section so that the light traveling through the first section is Raman amplified in the first section, and
the second excitation light source comprises a plurality of excitation light sources providing excitation lights to the second section so that the light traveling through the second section is Raman amplified in second section.

20. An apparatus comprising:
a first optical amplifier Raman amplifying a light in accordance with a plurality of excitation lights provided to the first optical amplifier; and
a second optical amplifier receiving the amplified light and amplifying the received light, wherein the first optical amplifier controls a power level of the amplified light as received by the second optical amplifier to be constant,
wherein the second optical amplifier comprises:
a first amplifier having a gain in a first wavelength band, the first amplifier receiving amplified light from the first optical amplifier in the first wavelength band and optically amplifying the received light, and
a second amplifier having a gain in a second wavelength band different from the first wavelength band, the second amplifier receiving amplified light from the first optical amplifier in the second wavelength band and optically amplifying the received light, wherein the first optical amplifier controls a power level of the amplified light as received by the first amplifier and a power level of the amplified light as received by the second amplifier to be constant.

21. An apparatus comprising:
a dispersion compensation fiber through which a signal light travels;
an excitation light causing a Raman gain to occur in the dispersion compensation fiber as the signal light travels through the dispersion compensation fiber, the excitation light comprising a plurality of lights having different wavelengths so that the Raman gain has a plurality of gain peaks;

a gain equalizer through which the signal light travels, and being upstream or downstream of the occurrence of the Raman gain in the dispersion compensation fiber; and means for controlling the gain equalizer to linearize the plurality of gain peaks in accordance with a monitored optical power or a monitored wavelength characteristic of linearized light output from the gain equalizer, and for controlling power of the excitation light to stabilize a nonlinear effect on the dispersion compensation fiber.

22. An apparatus as in claim 21, wherein the gain equalizer is upstream of the occurrence of the Raman gain in the fiber.

23. An apparatus as in claim 21, wherein the gain equalizer is a filter.

24. An apparatus as in claim 21, wherein the gain equalizer is a fiber grating filter, a dielectric multilayer filter, a Fabry-Perot etalon filter, or any combination of these filters.

25. An apparatus as in claim 21, wherein the gain equalizer is a plurality of erbium-doped fiber amplifiers.

* * * * *